US012057302B2

(12) United States Patent
Nishioka et al.

(10) Patent No.: US 12,057,302 B2
(45) Date of Patent: Aug. 6, 2024

(54) BACKING PLATE, SPUTTERING TARGET, AND PRODUCTION METHODS THEREFOR

(71) Applicant: SUMITOMO CHEMICAL COMPANY, LIMITED, Tokyo (JP)

(72) Inventors: Koji Nishioka, Osaka (JP); Naoya Satoh, Tokyo (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 576 days.

(21) Appl. No.: 17/294,964

(22) PCT Filed: Nov. 15, 2019

(86) PCT No.: PCT/JP2019/044890
§ 371 (c)(1),
(2) Date: May 18, 2021

(87) PCT Pub. No.: WO2020/105558
PCT Pub. Date: May 28, 2020

(65) Prior Publication Data
US 2022/0013342 A1    Jan. 13, 2022

(30) Foreign Application Priority Data
Nov. 21, 2018  (JP) .................................. 2018-218024

(51) Int. Cl.
*H01J 37/34*       (2006.01)
*C23C 14/34*       (2006.01)

(52) U.S. Cl.
CPC ...... *H01J 37/3435* (2013.01); *C23C 14/3407* (2013.01); *H01J 2237/332* (2013.01)

(58) Field of Classification Search
None
See application file for complete search history.

(56) References Cited

U.S. PATENT DOCUMENTS

2002/0153130 A1   10/2002   Okamoto et al.
2004/0194942 A1   10/2004   Okamoto et al.
(Continued)

FOREIGN PATENT DOCUMENTS

JP    2000-246452 A    9/2000
JP    2002-248584 A    9/2002
(Continued)

OTHER PUBLICATIONS

Decision to Grant a Patent issued in Japanese Patent Application No. 2019-207877 drafted Feb. 10, 2020.
(Continued)

*Primary Examiner* — Jason Berman
(74) *Attorney, Agent, or Firm* — Birch, Stewart, Kolasch & Birch, LLP

(57) ABSTRACT

An object of the present invention is to provide a production method for a backing plate that can reduce displacement of the groove. The present invention relates to a production method for a backing plate, comprising joining a plate-shaped body having a groove on one side and a cover member, wherein: the groove has at least two first parts extending in the longitudinal direction; a region where the body and the cover member are joined to each other has at least four first regions to be joined extending in the longitudinal direction and corresponding to two opposing side surfaces in each of the at least two first parts; and the joining of the body and the cover member to each other in the at least four first regions to be joined is performed by: (a) joining the body and the cover member to each other in one first region to be joined corresponding to one side surface in one first part; (b) joining the body and the cover member to each other in one region to be joined, among the remaining regions to be joined, corresponding to one side surface in another first part; and (c) repeating the step (b).

16 Claims, 9 Drawing Sheets

(56) References Cited

U.S. PATENT DOCUMENTS

| | | |
|---|---|---|
| 2006/0096748 A1 | 5/2006 | Okamoto et al. |
| 2006/0272802 A1 | 12/2006 | Sakayori et al. |
| 2007/0163120 A1 | 7/2007 | Okamoto et al. |
| 2016/0064200 A1 | 3/2016 | Taketomi et al. |

FOREIGN PATENT DOCUMENTS

| | | |
|---|---|---|
| JP | 2006-342367 A | 12/2006 |
| JP | 2014-231639 A | 12/2014 |
| JP | 2017-193779 A | 10/2017 |
| WO | WO 2017/010293 A1 | 1/2017 |

OTHER PUBLICATIONS

International Search Report for PCT/JP2019/044890 (PCT/ISA/210) mailed on Dec. 24, 2019.
Notice of Reasons for Refusal issued in Japanese Patent Application No. 2019-207877 drafted Dec. 23, 2019.

[Figure 1]
(a)
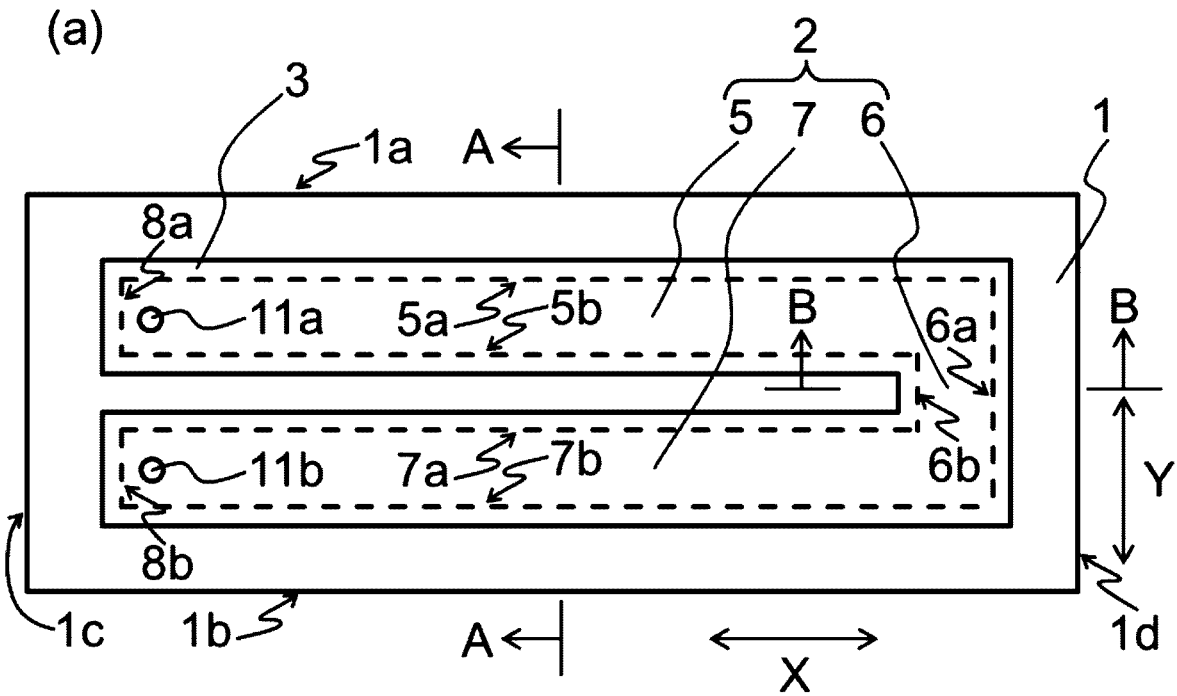
(b)
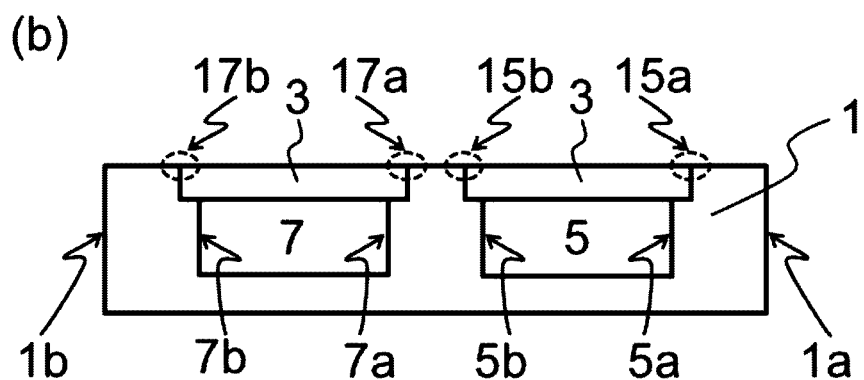
(c)
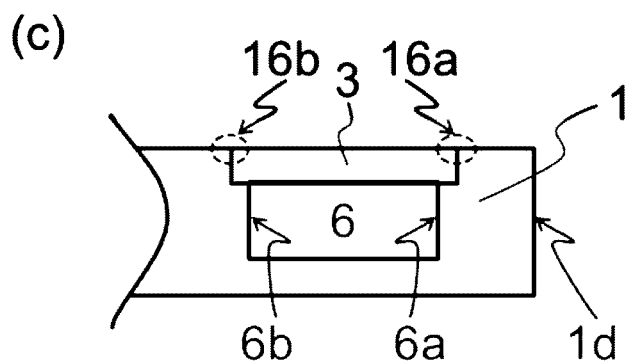

[Figure 2]
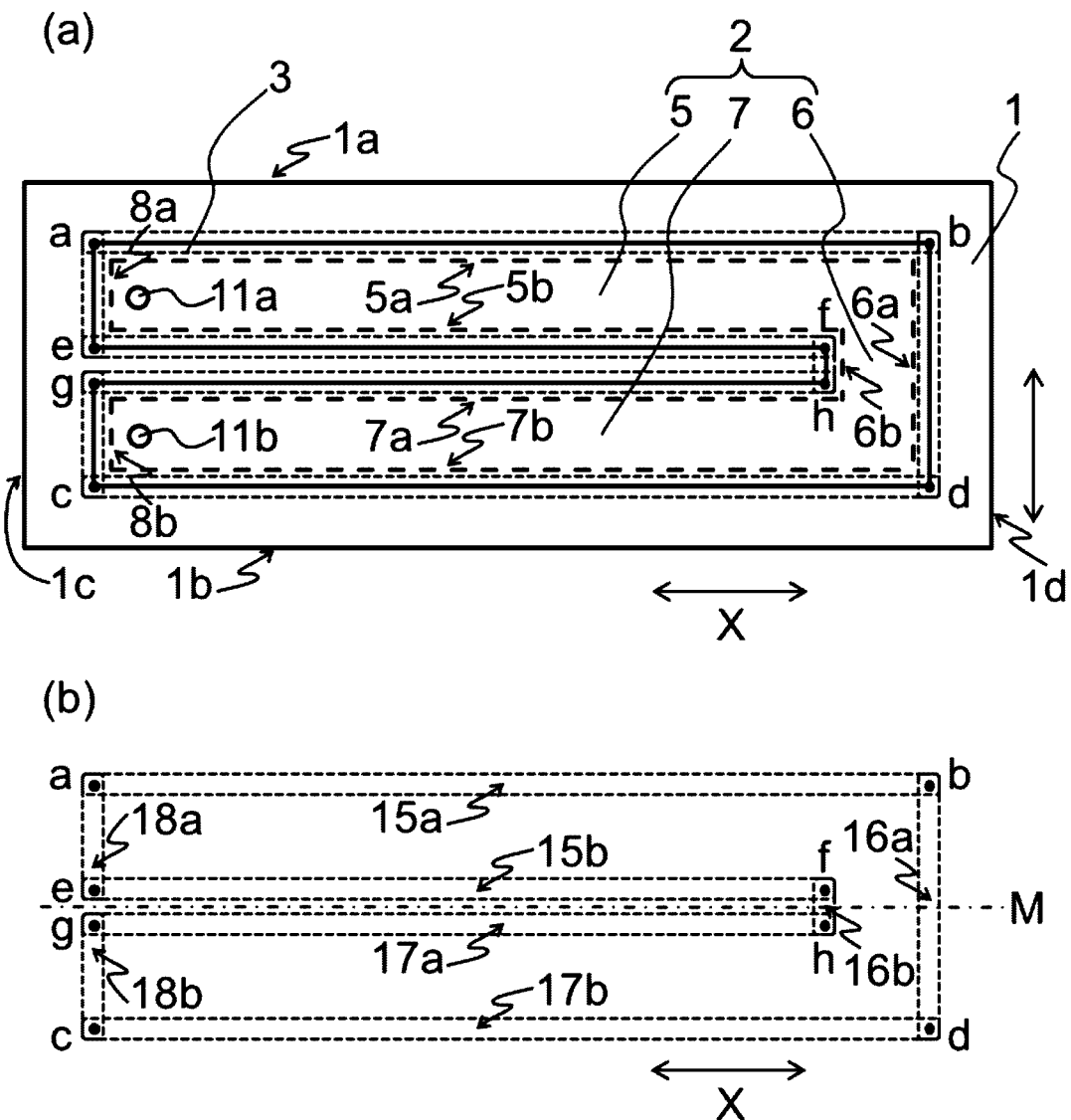

[Figure 3]
(a)
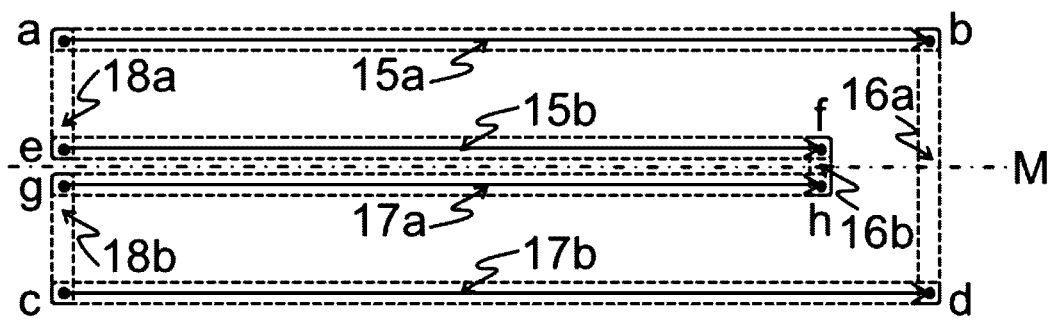
(b)
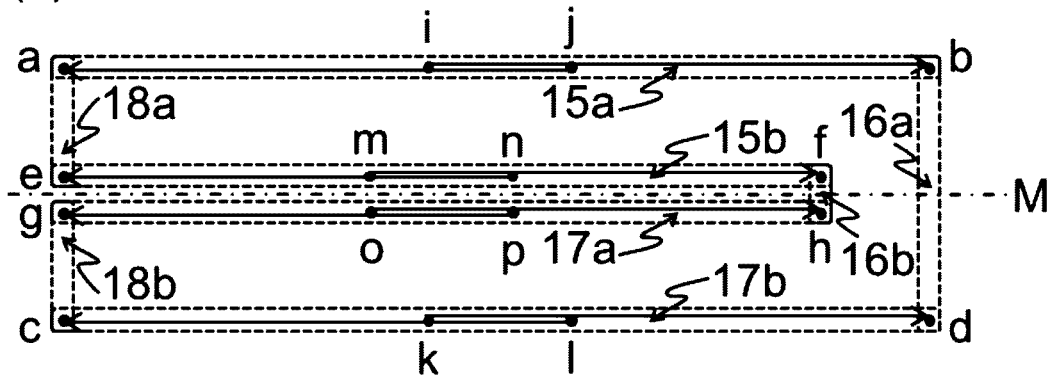

[Figure 4]
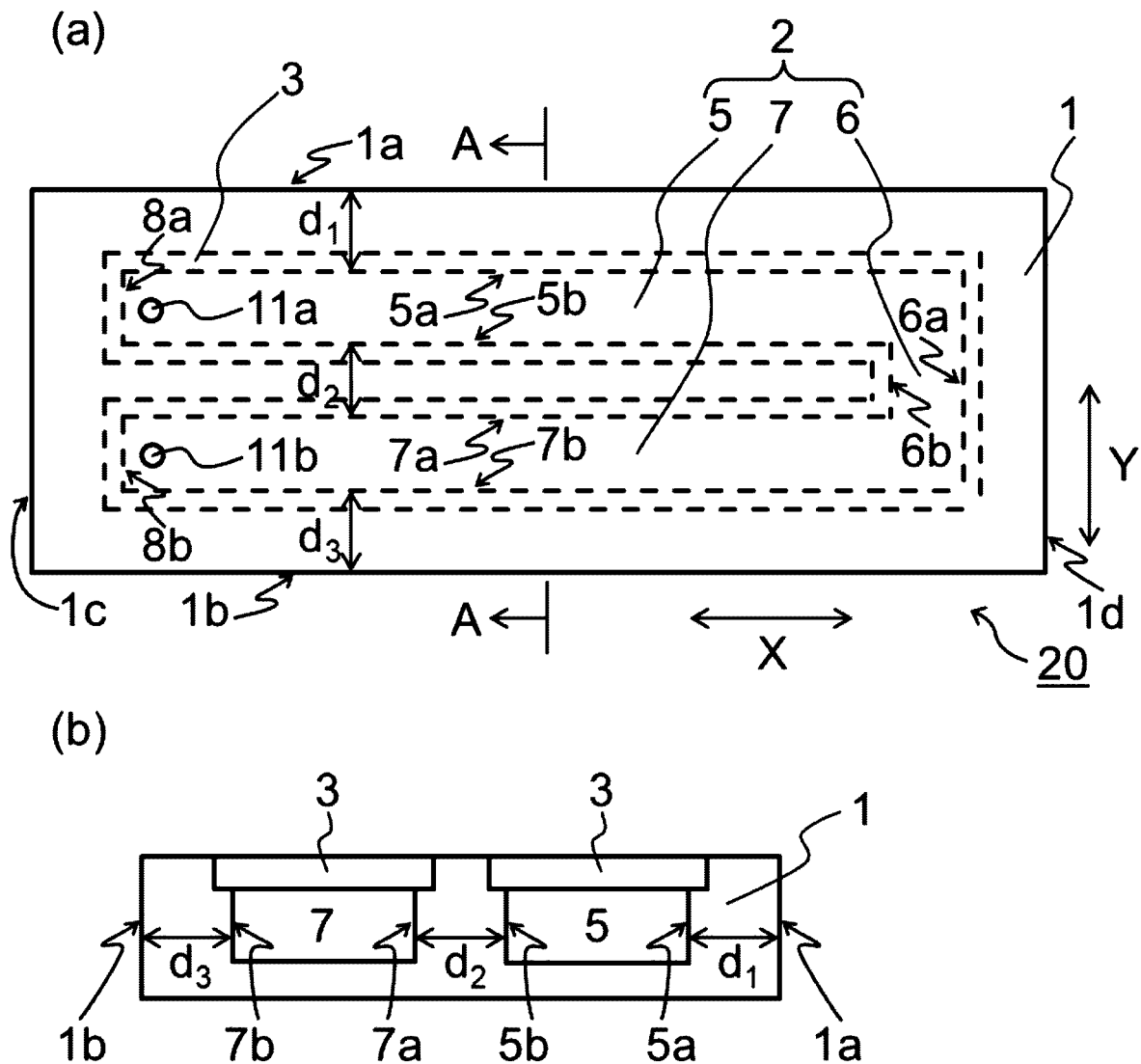

[Figure 5]
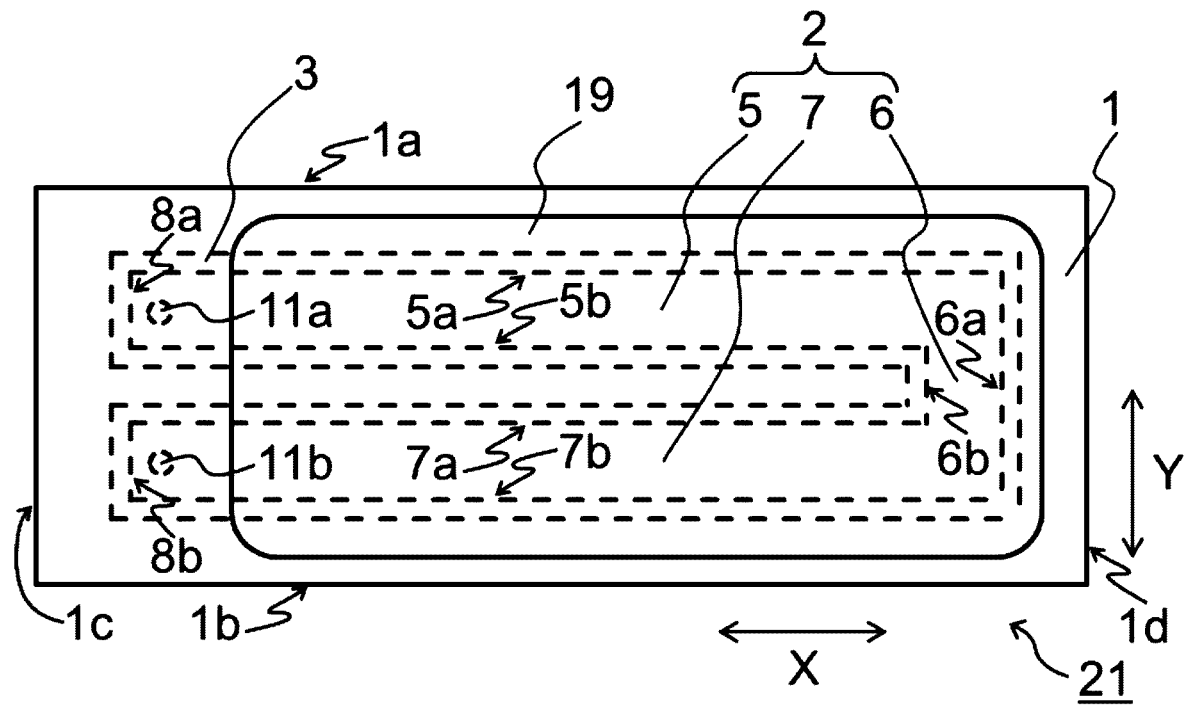

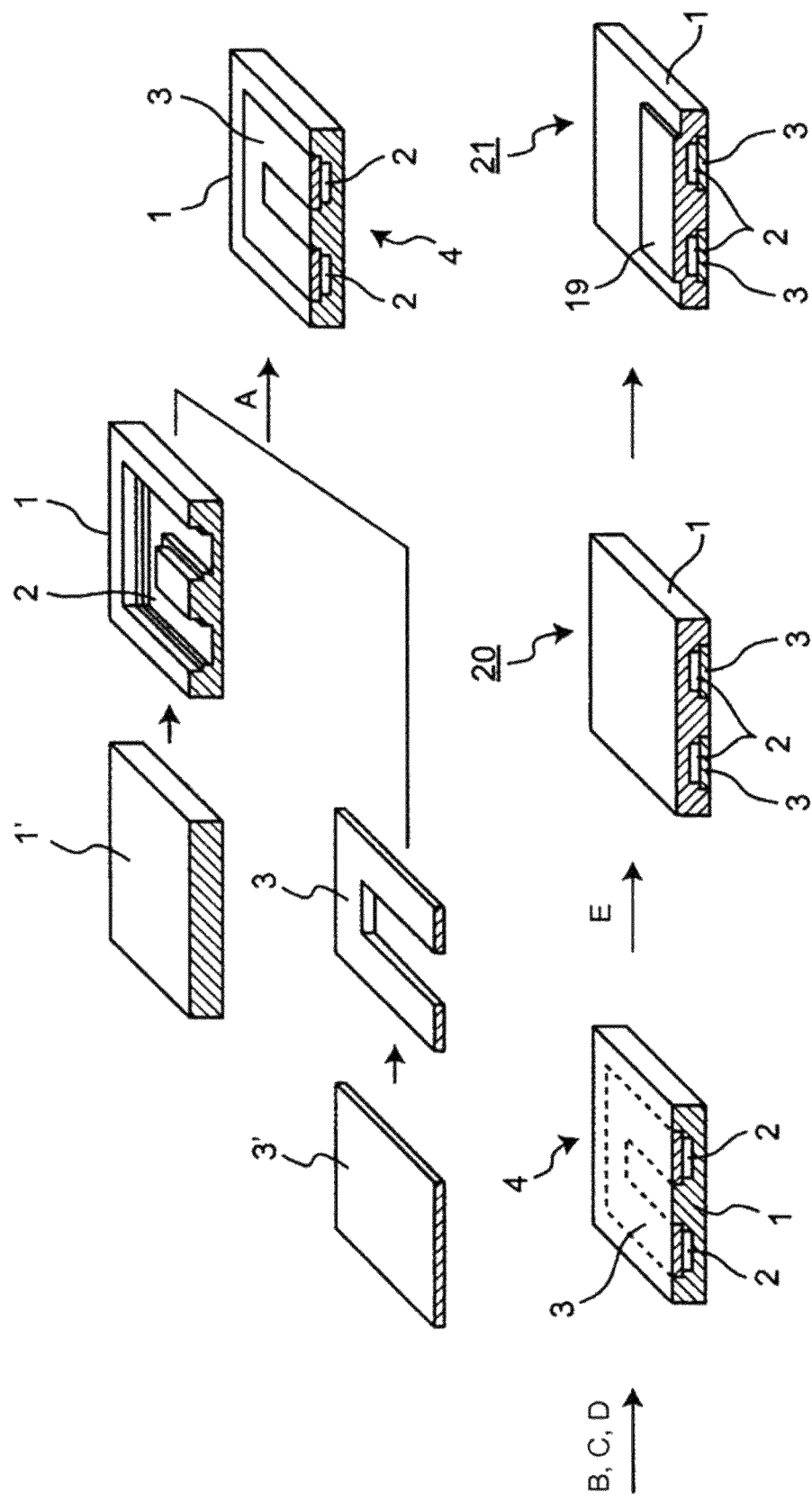
[Figure 6]

[Figure 7]
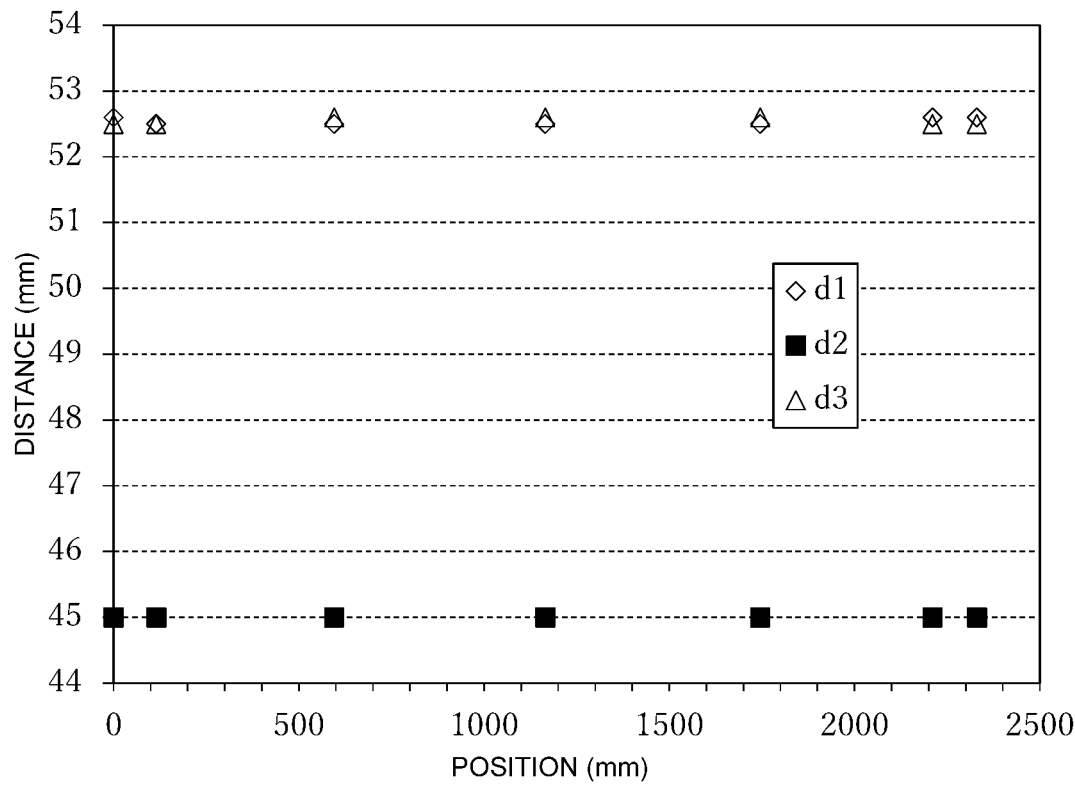
[Figure 8]
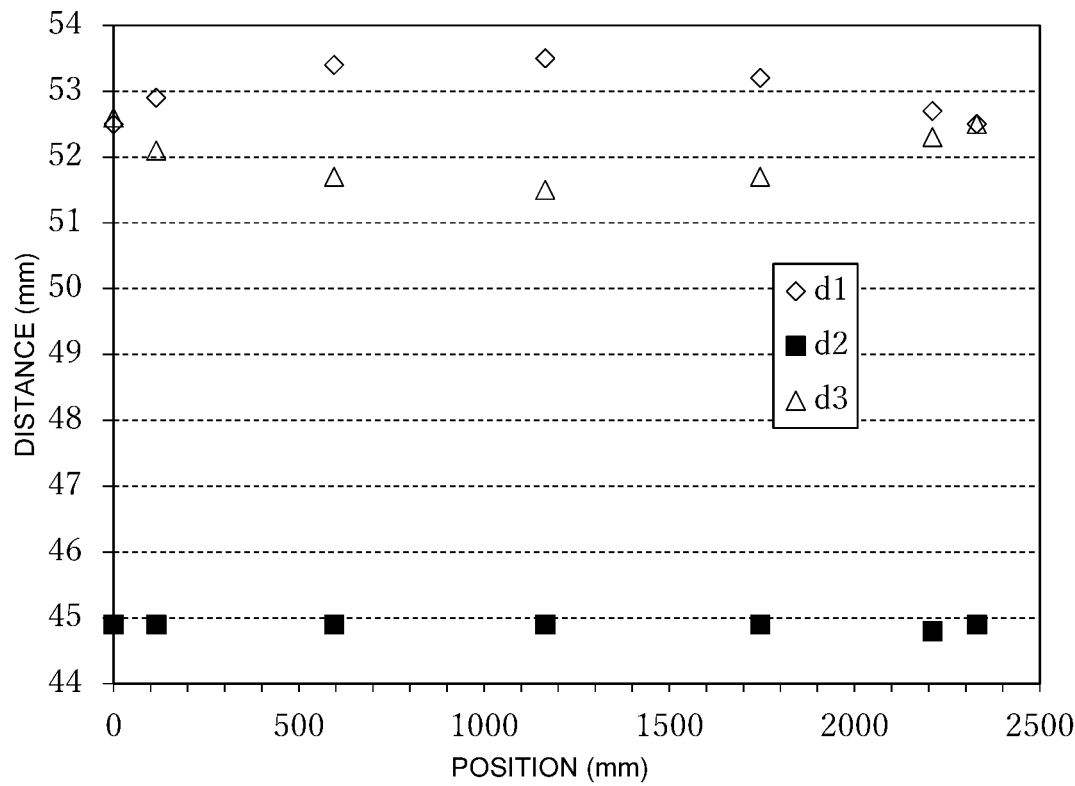

[Figure 9]
(a)
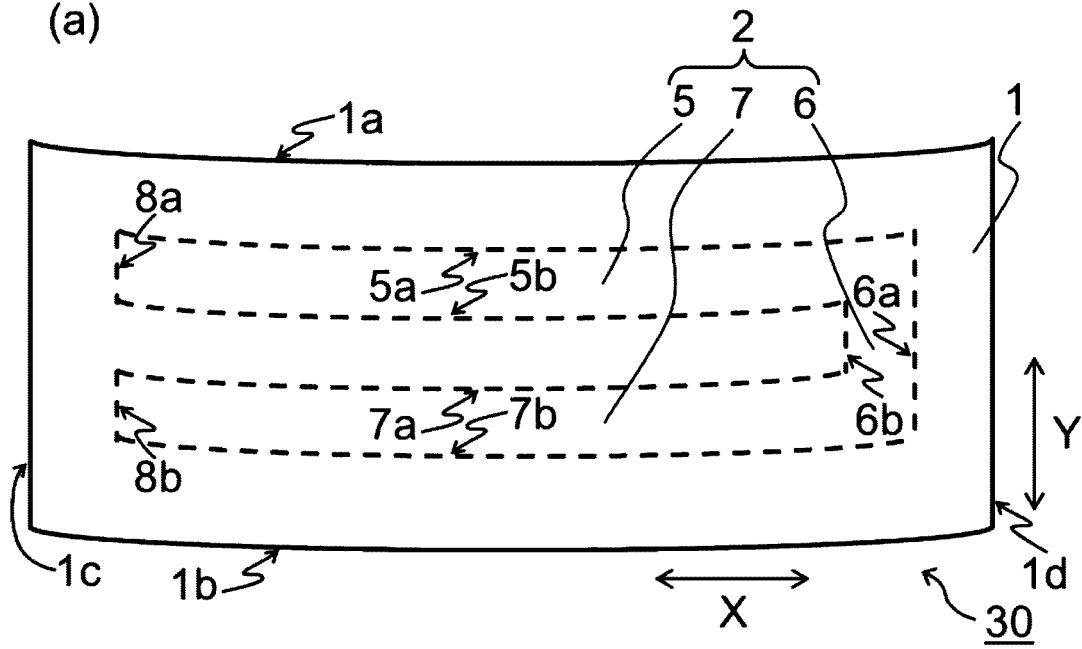
(b)
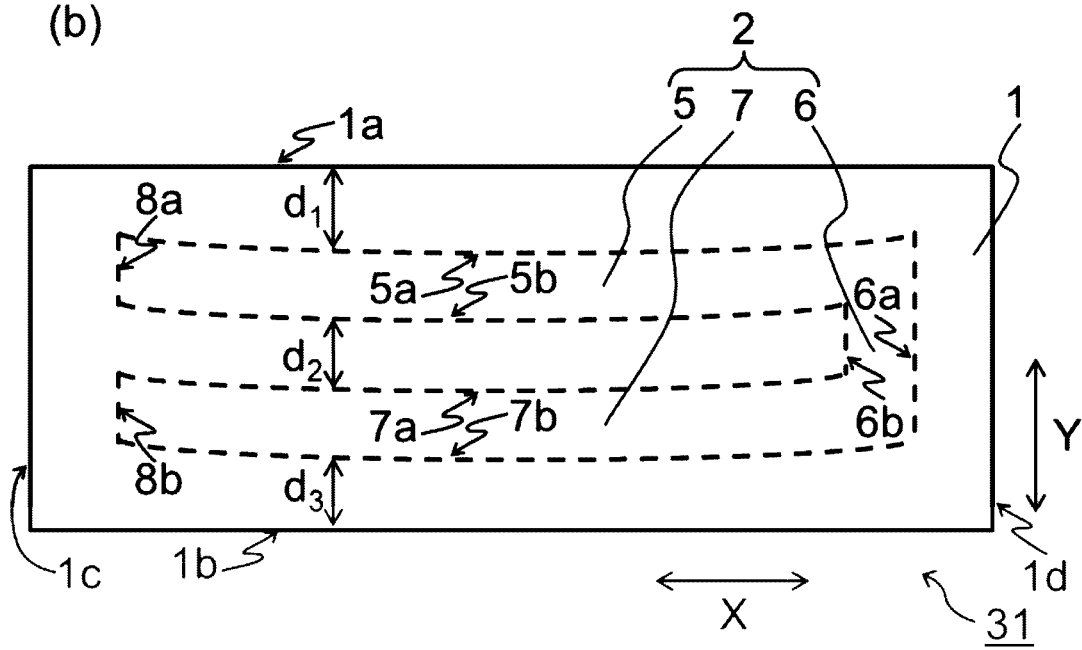

[Figure 10]
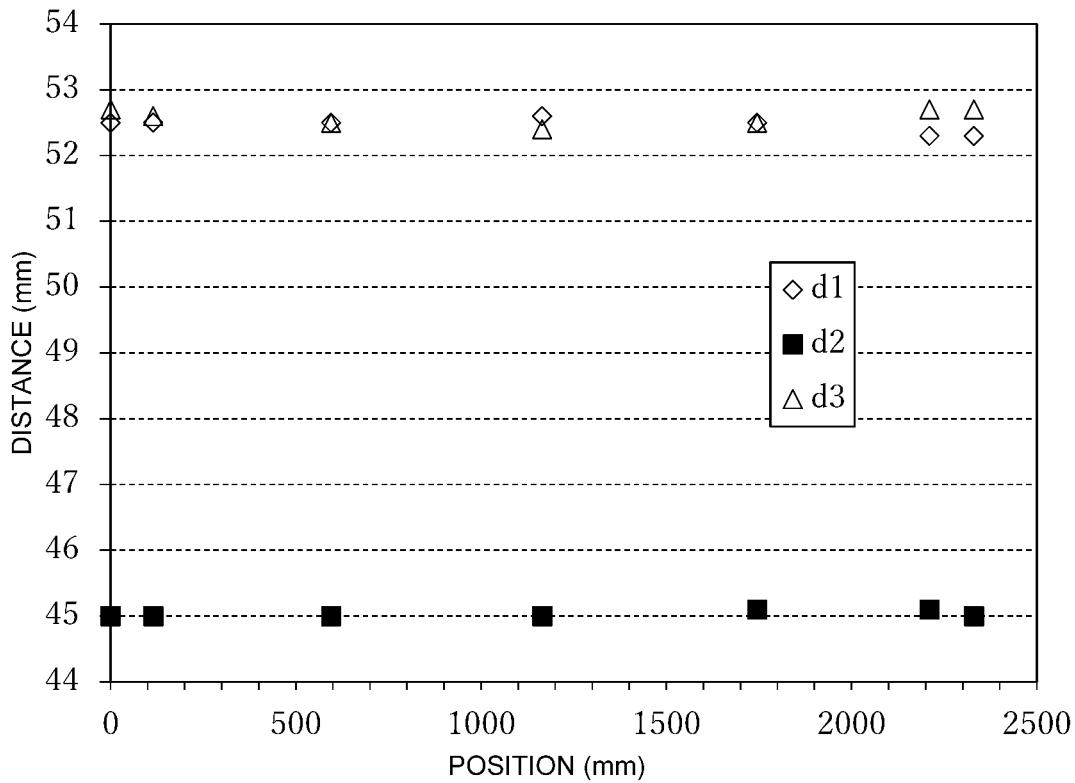
[Figure 11]
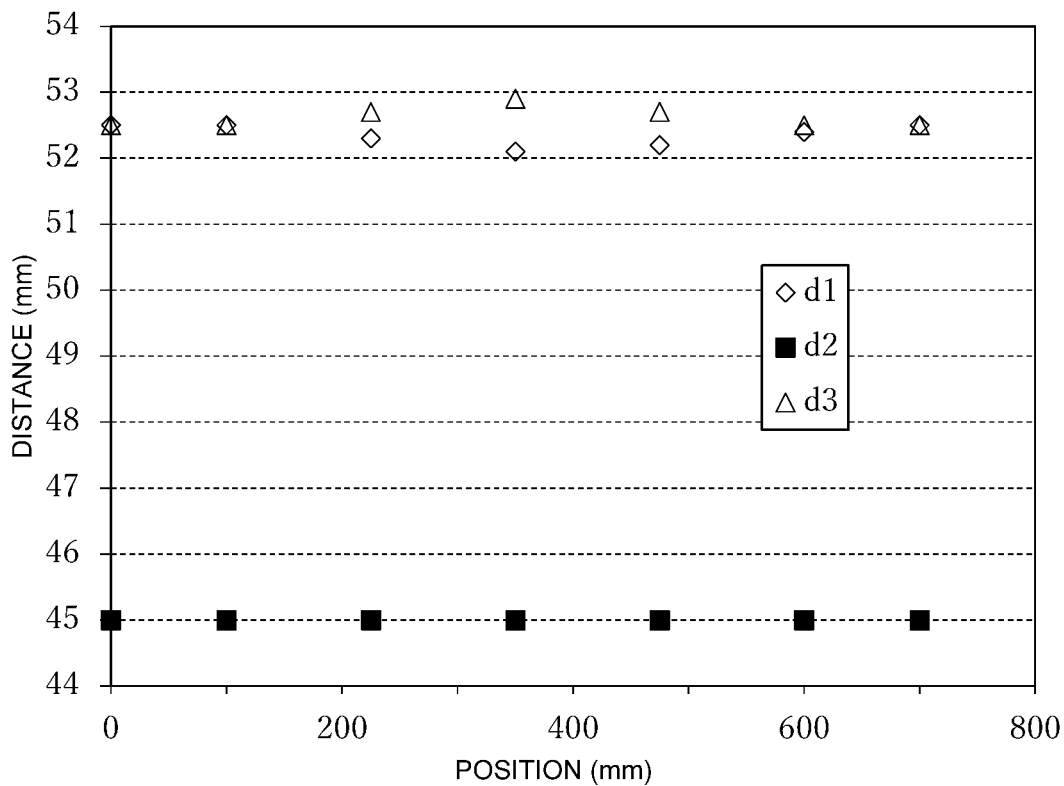

BACKING PLATE, SPUTTERING TARGET, AND PRODUCTION METHODS THEREFOR

TECHNICAL FIELD

The present invention relates to a backing plate, a sputtering target, and production methods therefor.

BACKGROUND ART

A backing plate is a member used to support the target material of the sputtering target used for sputtering and to fix the sputtering target to the sputtering apparatus. The backing plate also plays a role in dissipating the heat generated during sputtering.

A backing plate for a sputtering apparatus used in the formation of integrated circuits (ICs), for example, has a disk shape with a maximum diameter of about 500 mm to 600 mm, and is generally fabricated from a plate material such as copper alloy or aluminum alloy.

A backing plate for a sputtering apparatus used in the production of liquid crystal displays (LCDs), for example, has a plate (or panel or rectangular solid) shape and is generally fabricated from a plate material such as copper or copper alloy.

The target materials used in the sputtering apparatus for the production of LCDs are normally larger than those used for ICs, and the amount of heat generated during sputtering is also very large. Since the heat generated during sputtering affects the characteristics of the thin film formed by sputtering, a large backing plate that can efficiently cool the target material is used in the sputtering apparatus for the production of LCDs. When the backing plate used for the production of LCDs has a plate shape, in some cases, the length of the backing plate exceeds 3 meters.

For example, as disclosed in Patent Literatures 1 and 2, backing plates used in the production of LCDs and the like often have a flow channel formed inside thereof for the refrigerant fluid to pass through for the purpose of improving heat dissipation performance and cooling performance, in general. Such a flow channel can be formed by, for example, forming a groove for the flow channel in advance on the body that constitutes the backing plate, and joining a cover member fabricated so as to cover this groove by welding, for example, with the cover member engaged in the groove of the body. For the joining, welding such as friction stir welding or electron beam welding can be utilized.

CITATION LIST

Patent Literature

[Patent Literature 1] Japanese Patent Laid-Open No. 2002-248584
[Patent Literature 2] Japanese Patent Laid-Open No. 2017-193779

SUMMARY OF INVENTION

Technical Problem

A backing plate used in the production of LCDs is generally large and has a long dimension, and a relatively hard metal such as copper or copper alloy may be used therefor.

When forming a flow channel for refrigerant in such a backing plate, joining the body and the cover member to each other by welding causes problems by its heat such as the occurrence of distortion and deflection of the entire body including the cover member after the joining. In the case where joining is carried out by electron beam welding, a large amount of heat is added to the joint when the joint is irradiated with the electron beam, and in the case where joining is carried out by friction stir welding, a tool rotating at high speed is pushed into the joint and a large load is applied to the joint, which increases the possibility of the occurrence of distortion and deflection. Note that, in the present specification, the space formed by the groove of the body and the cover member in a state where the cover member is disposed on top of the groove of the body and joined thereto is called a flow channel.

After joining the body and the cover member to each other, it has been a common practice to carry out correction work by using a pressing machine or removal work for distortion by cutting processing to correct the distortion generated in the joined product.

Under such circumstances, previous studies by the present applicant have found a problem where, after joining the body and the cover member to each other, warpage can occur on the joining surface side of the joined product in the thickness direction of the joined product, and when such a joined product is corrected in the thickness direction and subjected to cutting processing by a general method, the thickness of the cover member can become non-uniform. In order to deal with such a problem, the present applicant has proposed that, after joining the body and the cover member to each other and integrating them, the body should be fixed such that, taking the joining surface of the body and the cover member as the upper surface, the difference between the maximum value and the minimum value of the height measured at the surface of the cover member is less than 0.5 mm, and at least a part of the joining surface should be processed by cutting (see Patent Literature 2).

Then, as a result of further studies by the present inventors, it has been newly found that, after joining the body and the cover member to each other, even in the in-plane direction of the joined product, warpage to one side of the two longitudinal side surfaces of the joined product opposing each other can occur, and when such a joined product is corrected in the thickness direction and subjected to cutting processing by a general method, the groove part formed in the body (more specifically, the groove and the cover member, and hence the flow channel, hereinafter the same) can be deviated in the width direction from the desired position.

Here, a joined product that is warped in the thickness direction and in-plane direction after joining the body and the cover member to each other can be corrected in the thickness direction since the joined product has a plate shape as a whole, whereas it is practically impossible to correct it in the in-plane direction. Accordingly, even when the joined product that remains warped in the in-plane direction after being corrected in the thickness direction is finished to the desired shape only externally by subjecting it to cutting processing on the joining surface, the pedestal surface, and the outer circumferential side surface, the groove part formed in the body is present in the joined product, and hence in the backing plate, remaining (curved and) displaced in the width direction due to the warpage to one side of the longitudinal side surfaces.

It has been found that displacement in the width direction (hereinafter, simply referred to as "displacement") in the groove part of the backing plate as described above means that the flow channel is present at a position deviating from the desired position with respect to the target during sputtering, and a problem is that sufficient cooling efficiency cannot be obtained. The target material may be bonded to the backing plate with a low melting point solder material, and in such a case, the target material may be peeled off from the backing plate when the cooling efficiency is not sufficient.

An object of the present invention is to provide a production method for a backing plate that can reduce displacement of the groove part and a backing plate with reduced displacement of the groove part. Another object of the present invention is to provide a production method for such a backing plate, a production method for a sputtering target using the backing plate, and a sputtering target using the backing plate.

Solution to Problem

According to one gist of the present invention, provided is a production method for a backing plate, comprising joining a plate-shaped body having a groove on one side through which a fluid passes and a plate-shaped cover member disposed on the body so as to cover the groove of the body, wherein:

the groove has at least two first parts extending in the longitudinal direction of the body;

a region where the body and the cover member are joined to each other has at least four first regions to be joined extending in the longitudinal direction of the body and corresponding to two opposing side surfaces in each of the at least two first parts; and the joining of the body and the cover member to each other in the at least four first regions to be joined is performed by:

step (a): a step of joining the body and the cover member to each other in one first region to be joined corresponding to one side surface in one first part;

step (b): a step of joining the body and the cover member to each other in one region to be joined, among the remaining regions to be joined, corresponding to one side surface in another first part, which is different from the first part that has been joined in the previous step, where the starting point of the joining is at a position separated from the end point of the joining in the previous step; and step (c): a step of repeating the step (b).

In one aspect of the present invention, the joining of the body and the cover member to each other in the at least four first regions to be joined may be performed in the same direction.

In one aspect of the present invention, the same direction may be either positive direction or opposite direction from one end side toward the other end side of the at least four first regions to be joined, or a combination of both.

In one aspect of the present invention, the joining of the body and the cover member to each other in the at least four first regions to be joined may be performed one by one in an order that constitutes symmetry in plan view with respect to the center line along the longitudinal direction of the body.

In one aspect of the present invention, the groove may have at least one second part extending in the width direction of the body and connecting the two adjacent first parts;

the region where the body and the cover member are joined to each other may have at least two second regions to be joined extending in the width direction of the body and corresponding to two opposing side surfaces in the at least one second part; and the joining of the body and the cover member to each other in the at least two second regions to be joined may be performed before or after performing the joining of the body and the cover member to each other in the at least four first regions to be joined.

In one aspect of the present invention, the body and the cover member may be joined to each other by electron beam welding or friction stir welding.

According to another gist of the present invention, provided is a joined product comprising a plate-shaped body having a groove on one side through which a fluid passes and a plate-shaped cover member disposed on the body so as to cover the groove of the body, wherein: the joined product has a length of 1000 mm or more; the body and the cover member are integrated by joining; the groove has at least two first parts extending in the longitudinal direction of the body; and the maximum distortion of a longitudinal side surface of the groove is less than 1 mm.

According to yet another gist of the present invention, provided is a joined product comprising a plate-shaped body having a groove on one side through which a fluid passes and a plate-shaped cover member disposed on the body so as to cover the groove of the body, wherein: the ratio of the length to the width of the joined product is 3.1 or more; the body and the cover member are integrated by joining; the groove has at least two first parts extending in the longitudinal direction of the body; and the maximum distortion of a longitudinal side surface of the groove is less than 1 mm.

According to yet another gist of the present invention, provided is a backing plate comprising a plate-shaped body having a groove on one side through which a fluid passes and a plate-shaped cover member disposed on the body so as to cover the groove of the body, wherein: the backing plate has a length of 1000 mm or more; the body and the cover member are integrated by joining; the groove has at least two first parts extending in the longitudinal direction of the body; and the difference between the maximum value and the minimum value of the distance from a longitudinal side surface of the body to the closest longitudinal side surface of the first part is less than 1 mm.

According to yet another gist of the present invention, provided is a backing plate comprising a plate-shaped body having a groove on one side through which a fluid passes and a plate-shaped cover member disposed on the body so as to cover the groove of the body, wherein: the ratio of the length to the width of the backing plate is 3.1 or more; the body and the cover member are integrated by joining; the groove has at least two first parts extending in the longitudinal direction of the body; and the difference between the maximum value and the minimum value of the distance from a longitudinal side surface of the body to the closest longitudinal side surface of the first part is less than 1 mm.

In one aspect of the present invention, the backing plate may have a length greater than 2000 mm.

In one aspect of the present invention, the backing plate may have a length greater than 2000 mm and not more than 5000 mm.

In one aspect of the present invention, the ratio of the length to the width of the backing plate may be 6.0 or more.

In one aspect of the present invention, the ratio of the length to the width of the backing plate is 7.0 or more and 40.0 or less.

According to yet another gist of the present invention, provided is a production method for a sputtering target comprising bonding a target material to a backing plate produced by the above production method for a backing plate of the present invention.

According to yet another gist of the present invention, provided is a sputtering target comprising a target material bonded onto any of the above backing plates of the present invention.

Advantageous Effects of Invention

The present invention provides a production method for a backing plate that can reduce displacement of the groove part and a backing plate (and its precursor, joined product) with reduced displacement of the groove part. The present invention also provides a production method for such a backing plate, a production method for a sputtering target using the backing plate, and a sputtering target using the backing plate.

BRIEF DESCRIPTION OF DRAWINGS

FIG. 1 is an outline drawing schematically describing a production method for a backing plate in one embodiment of the present invention, where (a) is a top view drawing (drawing viewed from the joining surface side) of a state in which a cover member is disposed on a body, (b) is a cross-sectional drawing viewed along the A-A line illustrated in (a), and (c) is a cross-sectional drawing viewed along the B-B line illustrated in (a).

FIG. 2 is a drawing illustrating a region where the body and the cover member are joined to each other, where (a) is a drawing illustrating the region to be joined superimposed with fine dotted lines on the drawing corresponding to FIG. 1(a), and (b) is a drawing illustrating the region to be joined extracted from (a).

FIG. 3 is a drawing illustrating the joining direction of the body and the cover member in the four first regions to be joined, where (a) illustrates one example of the case of joining in the positive direction or the opposite direction from one end side toward the other end side of the four first regions to be joined, and (b) illustrates one example of the case of joining in a combination of the positive direction and the opposite direction.

FIG. 4 is an outline drawing schematically illustrating one example of a backing plate that has been subjected to a post treatment after joining, where (a) is a top view drawing (drawing viewed from the joining surface side) and (b) is a cross-sectional drawing viewed along the A-A line illustrated in (a).

FIG. 5 is an outline bottom view drawing (drawing viewed from the pedestal surface side) schematically illustrating another example of a backing plate that has been subjected to a post treatment after joining.

FIG. 6 is an outline perspective view drawing schematically illustrating a production method for a backing plate, virtually cut off at the A-A line in FIG. 1(a).

FIG. 7 is a graph showing the measured values of distances $d_1$, $d_2$, and $d_3$ at a plurality of positions along the longitudinal direction for the backing plate of Example 1.

FIG. 8 is a graph showing the measured values of distances $d_1$, $d_2$, and $d_3$ at a plurality of positions along the longitudinal direction for the backing plate of Comparative Example 1.

FIG. 9 is an outline drawing schematically illustrating the joined product after joining and the backing plate that has been subjected to a post treatment in Comparative Example 1, where (a) is a top view drawing (drawing viewed from the joining surface side; however, illustrated with the cover member omitted) illustrating the joined product of Comparative Example 1 before mechanical processing and (b) is a top view drawing (drawing viewed from the joining surface side; however, illustrated with the cover member omitted) illustrating the backing plate of Comparative Example 1 that has been finished by mechanical processing.

FIG. 10 is a graph showing the measured values of distances $d_1$, $d_2$, and $d_3$ at a plurality of positions along the longitudinal direction for the backing plate of Example 2.

FIG. 11 is a graph showing the measured values of distances $d_1$, $d_2$, and $d_3$ at a plurality of positions along the longitudinal direction for the backing plate of Comparative Example 2.

DESCRIPTION OF EMBODIMENTS

Hereinafter, two embodiments of the present invention will be described in detail with reference to the drawings, but the present invention is not limited to these embodiments.

Embodiment 1

The present embodiment relates to a backing plate comprising a plate-shaped body having a groove on one side through which a fluid passes and a plate-shaped cover member disposed on the body so as to cover the groove of the body. Hereinafter, at first, a production method for this backing plate will be described in detail.

The production method for a backing plate 20 or 21 of the present embodiment comprises, as illustrated in FIGS. 1 to 6, joining a plate-shaped body 1 having a groove 2 on one side through which a fluid passes and a plate-shaped cover member 3 disposed on the body 1 so as to cover the groove 2 of the body 1.

<Body>

As illustrated in FIG. 6, the body 1 can be formed by processing a material 1' for the body by a method such as cutting or grinding.

The material 1' for the body may be constituted from an electrically conductive material, and it is preferable to use a plate-shaped (or panel-shaped or rectangular solid-shaped) material fabricated from a metal or its alloy.

Examples of the metal include, for example, copper, copper alloys (Cu—Cr alloys and the like), aluminum, aluminum alloys (A2024, A5052, and the like), titanium, titanium alloys, tungsten, tungsten alloys, molybdenum, molybdenum alloys, tantalum, tantalum alloys, niobium, niobium alloys, and stainless steel. From the viewpoints of processability, mechanical strength, durability, heat dissipation, and the like, it is preferable to use copper, and among copper, it is particularly preferable to use oxygen-free copper (purity of 99.96% or more, oxygen concentration of 10 ppm or less) from the viewpoints of high thermal conductivity and high electrical conductivity.

In the present invention, there is no particular limitation on the dimensions of the body 1, but from the viewpoint of ease of finishing the external shape of the backing plate to the desired size by mechanical processing, it is preferable that its size should be larger than the dimensions of the final backing plate to be produced.

For example, when the joined product has a plate (or panel or rectangular solid) shape, the length of the body 1 is preferably greater than the length of the backing plate by +10 mm or more, more preferably by +20 mm or more, and still more preferably by +30 mm or more. The upper limit value of the length of the body 1 is not particularly limited, but from the viewpoint of production cost, its dimension is preferably greater than the length of the backing plate by +500 mm or less, more preferably by +300 mm or less, still more preferably by +200 mm or less, and particularly preferably by +120 mm or less. Specifically, the length of the body 1 is, for example, 410 mm or more and 5500 mm or less, preferably 1000 mm or more and 5500 mm or less, more preferably 1020 mm or more and 5000 mm or less, still more preferably 2020 mm or more and 4500 mm or less, even more preferably 2070 mm or more and 4000 mm or less, and especially preferably 2450 mm or more and 3700 mm or less. The width of the body 1 is preferably greater than the width of the backing plate by +3 mm or more, more preferably by +5 mm or more, still more preferably by +7 mm or more, and particularly preferably by +10 mm or more. The upper limit value of the width of the body 1 is not particularly limited, but from the viewpoint of production cost, its dimension is preferably greater than the width of the backing plate by +50 mm or less, more preferably by +30 mm or less, and still more preferably by +25 mm or less. Specifically, the width of the body 1 is, for example, 100 mm or more and 2050 mm or less, preferably 150 mm or more and 1550 mm or less, more preferably 185 mm or more and 550 mm or less, still more preferably 210 mm or more and 450 mm or less, even more preferably 220 mm or more and 330 mm or less, and particularly preferably 230 mm or more and 300 mm or less. Note that the length and the width may be the same as or different from each other, but it is easier to achieve the effects of the present invention when the width is small.

The thickness of the body 1 is preferably greater than the thickness of the backing plate by +1 mm or more and +10 mm or less, more preferably by +2 mm or more and +8 mm or less, still more preferably by +3 mm or more and +7 mm or less, and particularly preferably by +4 mm or more and +6 mm or less.

Note that, in the present invention, the "length", "width", and "thickness" of an object or the like (for example, joined product, backing plate, body, region to be joined, or the like) mean the dimensions of that object or the like in the longitudinal direction, in the width direction perpendicular to the longitudinal direction, and in the thickness direction perpendicular to the longitudinal and width directions.

The body 1 has a groove 2 on one side thereof at which a flow channel can be formed such that a liquid refrigerant (for example, a fluid such as water, ethanol, ethylene glycol, or a mixture of two or more thereof) or the like can pass through after joining with a cover member 3, which will be described in detail below.

As illustrated in FIG. 1(*b*), the groove 2 may have a shape that can support (or mount) the cover member 3, which will be described in detail below, for example, a step section. It is preferable that the groove 2 should have a shape or dimensions such that the surface of the cover member 3 and the surface of the body 1 are flush with each other after the joining of the cover member and the body 1. In addition, since the target material is generally bonded to the central section of the backing plate in the width direction, from the viewpoint of uniformly cooling the target material and improving the cooling efficiency, it is preferable that the groove 2 should be provided in a manner that constitutes general line symmetry, preferably line symmetry, with respect to the center line in the width direction along the longitudinal direction of the body 1, as illustrated in FIG. 1(*a*), for example. Furthermore, it is preferable that the groove 2 should be provided such that its longitudinal side surfaces are generally parallel, preferably parallel, to the above center line.

Here, as illustrated in FIG. 6, the body 1 having the groove 2 can be fabricated by, for example: at first, dynamically fixing a plate-shaped (or panel-shaped or rectangular solid-shaped) material 1' with appropriate dimensions, taking the surface on the side that is to become the pedestal surface (the surface on the opposite side to the surface that is to become the joining surface after joining) as the upper surface, using, for example, a vise, a vacuum chuck, or the like; then carry out face milling by milling using, for example, a rotating tool such as a face mill or a cutter; next, taking this pedestal surface as the lower surface, dynamically fix the material, using, for example, a vise, a vacuum chuck, or the like; carry out face milling by milling using, for example, a rotating tool such as a face mill or a cutter, if required; and then cutting the material, using, for example, a face mill or a cutter, thereby fabricating the body 1 having the groove 2. The body 1 thus fabricated may have an approximately constant thickness, and the pedestal surface, the surface on the side that is to become the joining surface, and the bottom surface of the groove 2 may be generally parallel, preferably parallel to each other. In addition, the outer circumferential surface of the body 1 may be processed by cutting or polishing at an arbitrary stage, if required.

Note that, when the material 1' has no warpage, distortion, torsion, or the like and a horizontal surface is ensured, that surface can be used as the pedestal surface as it is, and the groove 2 may be formed on the opposite side as mentioned above.

<Cover Member>

The cover member 3 is a member that can be disposed on the body 1 so as to cover (or block) the groove 2 of the body 1, as illustrated in FIG. 1 and FIG. 6, for example, and is normally a plate-shaped (or panel-shaped) member with a thickness of 2 mm to 6 mm. For ease of installation of the cover member 3 on the body 1, it is better for the width of the cover member 3 to be larger than the width of the groove 2 such that the cover member 3 can be mounted on the step section of the body 1 illustrated in FIG. 1(*b*). When the thickness of the cover member 3 is designed to be 5 mm or less, particularly 3.5 mm or less, deformation of the cover member 3 is likely to occur due to pressurization to the flow channel, and therefore, the width of the cover member 3 is preferably sized to be greater than the width of the groove 2 by +30 mm or less, preferably by +20 mm or less, and more preferably by +15 mm or less. In addition, the thickness of the cover member 3 may be determined as appropriate, and the cover member 3 may have a thickness of 1 mm or more and 10 mm or less, preferably 2 mm or more and 8 mm or less, more preferably 2.2 mm or more and 5 mm or less, still more preferably 2.5 mm or more and 4 mm or less, even more preferably 2.7 mm or more and 3.5 mm or less, and particularly preferably 3 mm or more and 3.3 mm or less. When the thickness of the cover member 3 is at the lower limit value described above or more, the deformation of the cover member 3 during pressurization to the flow channel can be suppressed or the amount of deformation can be reduced. Also, when the thickness of the cover member 3 is at the upper limit value described above or less, the depth of the region where the cover member 3 and the body 1 are joined to each other (joining depth) can be made relatively shallow, which makes it easier to reduce the amount of heat input during joining and can suppress the deformation of the groove part during joining.

A material 3' for the cover member from which the cover member 3 can be formed may be constituted from an electrically conductive material, and it is preferable to use a plate-shaped (or panel-shaped) material fabricated from a metal or its alloy.

Examples of the metal include, for example, copper, copper alloys (Cu—Cr alloys and the like), aluminum, aluminum alloys (A2024, A5052, and the like), titanium, titanium alloys, tungsten, tungsten alloys, molybdenum, molybdenum alloys, tantalum, tantalum alloys, niobium, niobium alloys, and stainless steel. From the viewpoints of processability, mechanical strength, durability, heat dissipation, and the like, it is preferable to use copper, and among copper, it is particularly preferable to use oxygen-free copper (purity of 99.96% or more, oxygen concentration of 10 ppm or less) from the viewpoints of high thermal conductivity and high electrical conductivity. Among oxygen-free copper, it is still more preferable to use oxygen-free copper of a temper grade ¼H to H, which has high strength.

The material 3' may be the same as or different from the material 1', but from the viewpoint of integrating the cover member 3 and the body 1 by joining and keeping the strength of the joint high, it is preferable that they should be the same material or a material having the same composition and purity.

The cover member 3 can be formed by: dynamically fixing a material 3' with appropriate dimensions, using a restraining tool such as a vise, a clamp, or a vacuum chuck; and cutting off or cutting the material, using, for example, a band saw, a wire saw, a circular saw, a lathe, a milling machine, an endless saw, a grinder, a water jet, or the like. The cover member thus formed may have an approximately constant thickness, and the front and rear surfaces may be generally parallel, preferably parallel to each other. In addition, the outer circumferential surface of the cover member 3 may be processed by cutting or polishing at an arbitrary stage, if required.

Furthermore, at an arbitrary stage, holes may be formed at any locations of the cover member 3 through which a fluid can pass, such as holes 11a and 11b illustrated in FIG. 1(a), if required. Note that, although there is no particular limitation on the number of holes 11a and 11b, they are formed depending on the desired flow of fluid in the groove 2 (for example, one of the holes 11a and 11b may be utilized as a fluid inlet and the other as a fluid outlet). In particular, it is preferable to form holes 11a and 11b on the cover member 3 before joining it to the body 1, so that the air surrounded by the body 1 and the cover member 3 can escape through the holes 11a and 11b when fitting the cover member 3 to the body 1 or when joining them, thereby suppressing the occurrence of disagreement in the joint.

A. Joining of Body and Cover Member

The body 1 and the cover member 3, as mentioned above, are joined together to integrate them. For example, as illustrated in FIG. 1 and FIG. 6, the cover member 3 is disposed on the body 1 such that the cover member 3 covers the groove 2 of the body 1, and preferably, these members are disposed such that the surface of the body 1 and the surface of the cover member 3 are flush with each other.

There is no particular limitation on the joining method for the body 1 and the cover member 3, and for example, welding such as electron beam welding (EBW), friction stir welding (FSW), TIG welding, laser beam welding, MIG welding, and MAG welding can be applied thereto. Among the above, electron beam welding or friction stir welding is preferable from the viewpoints of small weld beads, small weld distortion, and the like. Since electron beam welding is more prone to distortion than friction stir welding, it can obtain the effects of the present embodiment particularly remarkably.

Note that a joined product 4 (and hence the backing plate 20 or 21) obtained by joining the body 1 and the cover member 3 to integrate them has excellent airtightness at the joint. For example, even when air pressurized to 0.1 MPa to 0.8 MPa is injected into the flow channel, the air does not leak and its airtightness can be maintained.

Now, specific steps of joining will be described in detail. FIG. 2 is a drawing illustrating a region where the body 1 and the cover member 3 are joined to each other, where FIG. 2(a) is a drawing illustrating the region to be joined superimposed with fine dotted lines on the drawing corresponding to FIG. 1(a), and FIG. 2(b) is a drawing illustrating the region to be joined extracted from FIG. 2(a). As illustrated in FIG. 1 and FIG. 2, in the present embodiment, the groove 2 has two first parts 5 and 7 extending in the longitudinal direction X of the body 1. In addition, in the present embodiment, the region where the body 1 and the cover member 3 are joined to each other (more precisely, among the outer surface formed by the body 1 and the cover member 3 disposed thereon, a region where they are planned to be joined to each other) has four first regions to be joined 15a, 15b, 17a, and 17b extending in the longitudinal direction X of the body 1 and corresponding to two opposing side surfaces 5a, 5b, 7a, and 7b in each of the two first parts 5 and 7. The shape of the two opposing side surfaces 5a, 5b, 7a, and 7b in each of the first parts 5 and 7 is not particularly limited. However, in the case of a large backing plate for a sputtering apparatus that may be used in the production of flat panel displays such as liquid crystal displays (LCDs), the side surfaces 5a, 5b, 7a, and 7b are each generally planar, preferably planar, and are also preferably generally parallel, more preferably parallel to each other from the viewpoint of smoothing the flow of liquid refrigerant in the flow channel and increasing the cooling efficiency. In addition, it is preferable that the side surfaces 5a and 7b and 5b and 7a should be equidistant from each other in plan view (or viewed from the upper surface) with respect to the center line M along the longitudinal direction X of the body 1. It is also preferable that the first regions to be joined 15a, 15b, 17a, and 17b should be in the same positional relationship as the corresponding side surfaces.

Also, in the present embodiment, the groove 2 has one second part 6 extending in the width direction Y of the body 1 and connecting the two adjacent first parts 5 and 7. The region where the body 1 and the cover member 3 are joined to each other has two second regions to be joined 16a and 16b extending in the width direction Y of the body 1 and corresponding to two opposing side surfaces 6a and 6b in the one second part 6.

In addition, the region where the body 1 and the cover member 3 are joined to each other has two third regions to be joined 18a and 18b extending in the width direction Y of the body 1 and corresponding to side surfaces 8a and 8b, respectively, positioned at the both end sections of the groove 2. Normally, the longitudinal direction X and the width direction Y are axes that are perpendicular to each other.

As described above, the region where the body 1 and the cover member 3 are joined to each other has the first regions to be joined 15a, 15b, 17a, and 17b, the second regions to be joined 16a and 16b, and the third regions to be joined 18a and 18b.

In the present embodiment, the joining of the body 1 and the cover member 3 to each other in the four first regions to be joined 15a, 15b, 17a, and 17b is performed by:

step (a): a step of joining the body 1 and the cover member 3 to each other in one first region to be joined (for example, first region to be joined 15a) corresponding to one side surface (for example, among side surfaces 5a and 5b, side surface 5a) in one first part (for example, first part 5);

step (b): a step of joining the body 1 and the cover member 3 to each other in one region to be joined (for example, first region to be joined 17b), among the remaining regions to be joined, corresponding to one side surface (for example, among side surfaces 7a and 7b, side surface 7b) in another first part (for example, first part 7) which is different from the first part that has been joined in the previous step, where the starting point (for example, c) of the joining is at a position separated from the end point (for example, b) of the joining in the previous step; and step (c): a step of repeating the step (b).

According to the present embodiment, any two consecutive steps among the above steps (a) to (c) can prevent two first regions to be joined corresponding to the respective two opposing side surfaces in one first part from being joined consecutively (more specifically, first regions to be joined 15a and 15b can be prevented from being joined consecutively and first regions to be joined 17a and 17b can be prevented from being joined consecutively); can also effectively reduce warpage of the joined product 4 obtained after the joining to one side of the longitudinal side surfaces 1a and 1b due to heat input during joining since the starting points of the joining in the steps (b) and (c) are at positions separated from the end points of the joining in their previous steps; and can also reduce displacement in the width direction of the groove 2 in the joined product 4 and hence in the backing plate 20 or 21. When two first regions to be joined corresponding to the respective two opposing side surfaces in one first part are joined consecutively, or when the starting point of the joining is at a position in close proximity to the end point of the joining in the previous step, the heat input to the joined product 4 (body 1) is biased to one part, or further heat input near the location where the temperature has been raised causes a temperature gradient in the joined product 4 (body 1), which biases the amount of elongation of the material and causes warpage. Also, it is preferable that the butted section of the body 1 and the cover member 3 should be in a state of close contact, but due to processing accuracy and disagreement during fitting, they are not in a state of completely close contact and a space is generally created. Therefore, during joining, a phenomenon occurs in which a part of the cover member 3 and the body 1 moves to fill that space and each is pulled toward the joint side. As a result, when two first regions to be joined corresponding to the respective two opposing side surfaces in one first part are joined consecutively, or when the starting point of the joining is at a position in close proximity to the end point of the joining in the previous step, warpage due to the space in the butted section of the body 1 and the cover member 3 is likely to occur in one direction, and warpage is likely to occur particularly in the central section of the region to be joined in the longitudinal direction.

In more detail, although not limiting the present embodiment, the starting point of the joining may be at another first part, which is different from the first part that has been joined in the previous step and may be at a position separated from the end point of the joining in the previous step.

That is, for example, the joining order may be as in examples 1 to 8 shown in Table 1. Note that, representatively, the example 1 in Table 1 means that the first region to be joined 15a is joined firstly, the first region to be joined 17b is joined secondly, the first region to be joined 15b is joined thirdly, and the first region to be joined 17a is joined fourthly.

TABLE 1

| | Order | | | | | | | |
|---|---|---|---|---|---|---|---|---|
| | ex. 1 | ex. 2 | ex. 3 | ex. 4 | ex. 5 | ex. 6 | ex. 7 | ex. 8 |
| First region to be joined 15a | 1 | 1 | 3 | 3 | 2 | 4 | 2 | 4 |
| First region to be joined 15b | 3 | 3 | 1 | 1 | 4 | 2 | 4 | 2 |
| First region to be joined 17a | 4 | 2 | 4 | 2 | 1 | 1 | 3 | 3 |
| First region to be joined 17b | 2 | 4 | 2 | 4 | 3 | 3 | 1 | 1 |

In the present invention, the expression "the starting point of the joining is at a position separated from the end point of the joining in the previous step" means that the starting points of the joining in the steps (b) and (c) and the end points of the joining in their previous steps are not adjacent to each other in the region to be joined. In other words, a case is excluded where the starting point of the joining is at the minimum (or nearly minimum) distance in the region to be joined relative to the end point of the joining in the previous step. The starting points of the joining in the steps (b) and (c) and the end points of the joining in their previous steps may be separated, for example, by a distance of ¼ or more, preferably ⅓ or more, of the length of the first region to be joined that has been joined in the previous step.

Without limiting the present embodiment, the joining of the body 1 and the cover member 3 to each other in the four first regions to be joined 15a, 15b, 17a, and 17b may be performed in the same direction. This increases the distance between the starting point of the joining and the end point of the joining in the previous step, and can suppress the occurrence of a temperature gradient in the body 1 due to heat input during joining. In particular, the effect of suppressing deformation of the joined product 4, that is, deformation of the groove part, is remarkable when each first region to be joined is joined consecutively without providing a cooling time. In addition, joining at each first region to be joined can be performed in the same manner, which can improve workability. Here, the term "same direction" means that the joining direction performed for one first region to be joined is, as a whole, the same as the joining direction performed for other first regions to be joined.

For example, the "same direction" may be either positive direction or opposite direction from one end side toward the other end side of the four first regions to be joined, or a combination of both.

For example, when either positive direction or opposite direction is employed, as illustrated in FIG. 3(a), if one end side of the four first regions to be joined 15a, 15b, 17a, and 17b is designated as points a, e, g, and c, and the other end side is designated as points b, f, h, and d, the first region to be joined 15a may be joined in the positive direction from the point a toward the point b; the first region to be joined 15b may be joined in the positive direction from the point e toward the point f; the first region to be joined 17a may be joined in the positive direction from the point g toward the point h; and the first region to be joined 17b may be joined in the positive direction from the point c toward the point d. Alternatively, all of them may be joined in the opposite direction. For example, when the first regions to be joined 15a, 15b, 17a, and 17b are joined in the order of example 1 shown in Table 1, they may be joined in the order from the point a to the point b, from the point c to the point d, from the point e to the point f, and from the point g to the point h.

For example, when the positive direction and the opposite direction are combined, as illustrated in FIG. 3(b), if one end side of the four first regions to be joined 15a, 15b, 17a, and 17b is designated as points a, e, g, and c, and the other end side is designated as points b, f, h, and d, the first region to be joined 15a may be joined in the positive direction from a point i toward the point b, and then in the opposite direction from a point j toward the point a; the first region to be joined 15b may be joined in the positive direction from a point m toward the point f, and then in the opposite direction from a point n toward the point e; the first region to be joined 17a may be joined in the positive direction from a point o toward the point h, and then in the opposite direction from a point p toward the point g; and the first region to be joined 17b may be joined in the positive direction from a point k toward the point d, and then in the opposite direction from a point l toward the point c. For example, when the first regions to be joined 15a, 15b, 17a, and 17b are joined in the order of example 1 shown in Table 1, they may be joined in the order from the point i to the point b, from the point j to the point a, from the point k to the point d, from the point l to the point c, from the point m to the point f, from the point n to the point e, from the point o to the point h, and from the point p to the point g. Alternatively, when joined in the order of example 4, they may be joined in the order from the point m to the point f, from the point n to the point e, from the point o to the point h, from the point p to the point g, from the point i to the point b, from the point j to the point a, from the point k to the point d, and from the point l to the point c.

Without limiting the present embodiment, the joining of the body 1 and the cover member 3 to each other in the four first regions to be joined 15a, 15b, 17a, and 17b may be performed one by one in an order that constitutes symmetry in plan view (or viewed from the upper surface) with respect to the center line M along the longitudinal direction X of the body 1. Note that the expression "in an order that constitutes symmetry with respect to the center line" means that any one first region to be joined is joined and then a region to be joined that constitutes symmetry with respect to the center line is joined, the operation of which is repeated as appropriate depending on the number of first regions to be joined that are present. Representatively, as in the example 1 shown in Table 1, the first region to be joined 15a may be joined; then the first region to be joined 17b, which constitutes symmetry to this region with respect to the center line M, may be joined; thereafter the first region to be joined 15b may be joined; and then the first region to be joined 17a, which constitutes symmetry to this region with respect to the center line M, may be joined. This can even further effectively reduce the warpage of the joined product 4 obtained after the joining to one side of the longitudinal side surfaces 1a and 1b due to heat input during joining, and can also even further reduce the displacement in the width direction of the groove (or, in a broader sense, the groove part) in the joined product 4 and hence in the backing plate 20 or 21.

In addition, in the present embodiment, before or after performing the joining of the body 1 and the cover member 3 in the four first regions to be joined 15a, 15b, 17a, and 17b, joining of the body 1 and the cover member 3 in the two second regions to be joined 16a and 16b mentioned above is performed, and joining of the body 1 and the cover member 3 in the two third regions to be joined 18a and 18b mentioned above is performed. The order in which the joining is performed in the second regions to be joined 16a and 16b and the third regions to be joined 18a and 18b is not particularly limited. For example, before or after performing the joining in the first regions to be joined 15a, 15b, 17a, and 17b, the second regions to be joined 16a and 16b and the third regions to be joined 18a and 18b may be joined in this order in any direction.

In the joining steps described above, in order to prevent displacement of the region to be joined due to warpage or distortion of the body 1 during joining, it is preferable that the body 1 should be fixed to the plane table of the joining apparatus or welding machine with a vise or a clamp. Also, in order to prevent warpage or displacement of the cover member due to internal stress in the body 1, the cover member 3, or the joined product 4 caused by heat input during joining, it is preferable that the body 1 and the cover member 3 should be temporarily fixed. The temporary fixing can be carried out by the joining methods exemplified above.

In the above manner, the joined product 4, in which the body 1 and the cover member 3 are joined to each other, is obtained.

In the joined product 4 obtained as described above, for example, warpage to one side of the longitudinal side surfaces 1a and 1b can be reduced compared to the case where the first regions to be joined 15a, 15b, 17a, and 17b are joined in this order or in the reverse order. Note that, in the present invention, the expression "warpage to one side of the longitudinal side surfaces" of the joined product means that, when the joined product 4 is left to stand on an arbitrary horizontal plane with its joining surface on the upper side (and thus, with its pedestal surface on the lower side), both end sections of the longitudinal side surface 1a or 1b of the joined product 4 are deviated in the width direction compared to the central part of the longitudinal side surface 1a or 1b, when viewed from the upper surface of the joined product. Specifically, it means that, when the longitudinal side surface 1a or 1b of an undistorted joined product 4 is indicated by a virtual line, the longitudinal side surface 1a or 1b is deviated from this virtual line. The warpage of the joined product 4 to one side of the longitudinal side surfaces 1a and 1b, that is, based on a straight line (virtual line) connecting the both end sections of the longitudinal side surface 1a or 1b, the maximum distance $T_1$ between that straight line (virtual line) and the longitudinal side surface 1a or 1b of the joined product 4 (maximum distortion of the longitudinal side surfaces of the joined product), is preferably 1.2 mm or less, more preferably 1.0 mm or less, still more preferably 0.7 mm or less, and even more preferably 0.5 mm or less. In addition, the proportion of the maximum distance $T_1$ to the length of the joined product 4 is $0.35 \times 10^{-3}$ or less, preferably $0.30 \times 10^{-3}$ or less, more preferably $0.25 \times 10^{-3}$ or less, still more preferably $0.20 \times 10^{-3}$ or less, and particularly preferably $0.10 \times 10^{-3}$ or less. In addition, the proportion of the maximum distance $T_1$ to the length/width (aspect ratio) of the joined product 4 is 0.1 or less, preferably 0.70 or less, more preferably 0.50 or less, and still more preferably 0.30 or less. The maximum distance $T_1$ can be determined by, for example, installing the both ends of the longitudinal side surface 1a or 1b of the joined product 4 with the restraining tool removed on a processing machine such that they are mounted on a straight line (virtual line) parallel to the scanning axis of the processing machine; and using a measuring instrument such as a dial gauge attached to the processing machine and moving the processing machine in a linear manner with the end sections of the longitudinal side surface 1a or 1b of the joined product 4 as the origin, thereby measuring the distance between the longitudinal side surface 1a or 1b and the virtual line. Note that, when the joined product 4 has a long length, warpage to one side of the width direction side surfaces 1c and 1d is not likely to occur and can be to an extent that is practically negligible.

Also, in the joined product 4 obtained as described above, for example, displacement of the groove 2 in the width direction can be reduced compared to the case where the first regions to be joined 15a, 15b, 17a, and 17b are joined in this order or in the reverse order. Note that, in the present invention, the expression "displacement (in the width direction)" of the groove in the joined product or backing plate means that, when the joined product 4 (which may have undergone any post treatment step, if performed, and may be a backing plate, hereinafter the same) is left to stand on an arbitrary horizontal plane with its joining surface on the upper side (and thus, with its pedestal surface on the lower side), if the longitudinal side surface 5a of the first part 5 or the longitudinal side surface 7b of the first part 7 of the groove 2 of an undistorted joined product 4 is indicated by a virtual line, for example, the longitudinal side surface 5a of the first part 5 or the longitudinal side surface 7b of the first part 7 of the groove 2 is deviated from this virtual line, when viewed from the upper surface of the joined product. For example, the displacement of the longitudinal side surface 5a of the first part 5 or the longitudinal side surface 7b of the first part 7 of the groove 2 of the joined product 4, that is, based on a straight line (virtual line) connecting the both end sections of the longitudinal side surface 5a of the first part 5 or the longitudinal side surface 7b of the first part 7 of the groove 2, the maximum distance $T_2$ between that straight line (virtual line) and the longitudinal side surface 5a of the first part 5 or the longitudinal side surface 7b of the first part 7 of the groove 2 (maximum distortion of the longitudinal side surfaces of the groove (flow channel)), is less than 1 mm, preferably 0.8 mm or less, more preferably 0.5 mm or less, still more preferably less than 0.3 mm, and even more preferably 0.25 mm or less. In addition, the proportion of the maximum distance $T_2$ to the length of the joined product 4 is $0.35 \times 10^{-3}$ or less, preferably $0.30 \times 10^{-3}$ or less, more preferably $0.25 \times 10^{-3}$ or less, still more preferably $0.20 \times 10^{-3}$ or less, and particularly preferably $0.10 \times 10^{-3}$ or less. In addition, the proportion of the maximum distance $T_2$ to the length/width (aspect ratio) of the joined product 4 is 0.1 or less, preferably 0.70 or less, more preferably 0.50 or less, and still more preferably 0.30 or less. The maximum distance $T_2$ can be determined by the same method as for the maximum distance $T_1$, after removing the cover member 3 joined to the joined product 4 by cutting processing. The lower limit value of the maximum distance $T_2$ is not particularly limited, but it is preferably 0.005 mm or more, more preferably 0.01 mm or more, still more preferably 0.04 mm or more, and particularly preferably 0.05 mm or more. When the lower limit value is within the above range, in a sputtering target produced by bonding the target material and the backing plate, which will be mentioned later, it is easier to reduce the amount of warpage of the sputtering target when the target material and the backing plate are different materials, especially when the melting point of the target material is higher than the melting point of the backing plate material. When the linear expansion coefficients of the materials are different, the warpage of the target material and the backing plate when bonded is caused by the difference between the amount of elongation during heating and the amount of shrinkage during cooling. By slightly distorting the flow channel inside the backing plate, the direction of elongation of the backing plate during heating is slightly changed from the linear direction, and when the target material has a higher melting point than that of the backing plate material, the difference between the elongation in the linear direction of the target material and that of the backing plate becomes smaller and the difference in the amount of shrinkage during cooling is less likely to occur, making it difficult for the sputtering target to be warped.

Also, in a joined product 4 or backing plate that has been subjected to outer circumferential processing of at least the side surfaces (1a and 1b) of the joined product 4 and formed to eliminate warpage in appearance (warpage in the width direction), when the distances from the longitudinal side surfaces 1a and 1b of the body 1 to the nearest longitudinal side surfaces of the first parts 5 and 7 of the groove 2 (for example, the distance $d_1$ between the longitudinal side surface 1a of the body 1 and the longitudinal side surface 5a of the first part 5 of the groove 2, and the distance $d_3$ between the longitudinal side surface 1b of the body 1 and the longitudinal side surface 7b of the first part 7 of the groove 2) are not constant, it means that the displacement of the groove has occurred and the groove has shifted along the longitudinal direction X by a magnitude greater than 1 mm. The displacement of the groove 2 in the joined product 4 (and hence the backing plate) that has been subjected to outer circumferential processing of the side surfaces and has mechanical processing marks on the side surfaces, and more specifically, the differences between the maximum value and the minimum value of such distances (that is, the difference between the maximum value and the minimum value for the distance $d_1$ and the difference between the maximum value and the minimum value for the distance $d_3$) are both less than 1 mm, preferably 0.8 mm or less, more preferably 0.5 mm or less, still more preferably less than 0.3 mm, and even more preferably 0.25 mm or less. Furthermore, the proportion of the difference between the maximum value and the minimum value of the distance $d_1$ to the length of the joined product 4 and the proportion of the difference between the maximum value and the minimum value of the distance $d_3$ to the length of the joined product 4 are both $0.35 \times 10^{-3}$ or less, preferably $0.30 \times 10^{-3}$ or less, more preferably $0.25 \times 10^{-3}$ or less, still more preferably $0.20 \times 10^{-3}$ or less, and particularly preferably $0.10 \times 10^{-3}$ or less. In addition, the proportion of the difference between the maximum value and the minimum value of the distance $d_1$ to the length/width (aspect ratio) of the joined product 4 and the proportion of the difference between the maximum value and the minimum value of the distance $d_3$ to the length/width (aspect ratio) of the joined product 4 are both 0.1 or less, preferably 0.70 or less, more preferably 0.50 or less, and still more preferably 0.30 or less. The lower limit value of the difference between the maximum value and the minimum value for each of the distance $d_1$ and the distance $d_3$ is not particularly limited, but it is preferably 0.005 mm or more, more preferably 0.01 mm or more, still more preferably 0.04 mm or more, and particularly preferably 0.05 mm or more. When the lower limit value is within the above range, as mentioned above, it is easier to reduce the amount of warpage of the sputtering target when the target material and the backing plate are different materials, especially when the melting point of the target material is higher than the melting point of the backing plate material.

Here, since the maximum distance $T_2$ indicated above shows a numerical value equivalent to the difference between the maximum value and the minimum value for the distance $d_1$ or distance $d_3$, the displacement of the groove in the joined product can be evaluated by determining either of these values.

Since the joined product 4 of the present embodiment has, in its inside, a flow channel through which a fluid such as cooling water can pass, the surface on the opposite side to the joining surface has a cooling function and can also function as a pedestal surface on which the target material can be disposed, and therefore, it can be used as a backing plate for sputtering targets.

The joined product 4 may be used as a backing plate as it is. The description for the dimensions of the backing plate, which will be mentioned later, may be applied as the description for the dimensions of the joined product 4 as it is. Furthermore, the joined product 4 may be subjected to the following post treatment step to produce the backing plate, if required.

<Post Treatment Step>

Examples of the post treatment step include, for example, the following steps:

B. warpage correction in the thickness direction;
C. mechanical processing of the outer circumferential surface;
D. mechanical processing of the joining surface;
E. mechanical processing of the pedestal surface;
F. finishing processing of the joining surface;
G. finishing processing of the pedestal surface;
H. drilling processing; and
I. warpage correction in the thickness direction.

It is preferable that the post treatment step should be carried out in the order of steps B through I described above, but it is not limited to such an order. In addition, the steps B to I described above are all arbitrary steps and can be carried out in any order. Hereinafter, each step will be briefly described.

B. Warpage Correction in the Thickness Direction

In the joined product 4 obtained by the joining of the present embodiment, warpage in the in-plane direction (width direction) is reduced, but warpage may still occur in the thickness direction. In such a case (especially when the joined product 4 has a long length greater than 2000 mm or the like), it is preferable to correct the joined product 4, for example, using a correcting machine, until the size of warpage is reduced to a level where it can be fixed to ground on a horizontal surface, preferably to less than 5 mm, while taking care not to deform the cover member 3. Note that, in the present invention, "warpage in the thickness direction" of the joined product 4 means, when the joined product 4 is left to stand on an arbitrary horizontal plane with its joining surface on the upper side (and hence with the pedestal surface on the lower side), a case in which the lower edge section of at least one end section in the longitudinal direction or the width direction (width direction crossing the longitudinal direction perpendicularly) of the joined product 4 is positioned apart from this horizontal plane, or a case in which the lower edge sections of all end sections are in contact with the horizontal plane, but only the lower central section of the joined product 4 is separated from the horizontal plane. The maximum distance between this separated edge section or lower central section and the horizontal plane is expressed as the size of the "warpage in the thickness direction". Also, the lower edge section of the end section described above may be separated from the horizontal plane described above in a wavy manner, and even in this case, the maximum distance between such horizontal plane and the edge section is expressed as the size of the "warpage in the thickness direction". In addition, since the "warpage in the thickness direction" occurring in the lower central section of the joined product 4 cannot be measured directly, the maximum value of the difference between the height of the joined product 4 measured at the surface of the cover member 3 and the thickness of the joined product 4 is expressed as the size of the "warpage in the thickness direction".

By correcting the warpage in the thickness direction, for example, the warpage in the thickness direction of at least one end section in the longitudinal direction preferably becomes less than 5 mm, and more preferably less than 1 mm. Also, the warpage in the thickness direction of at least one end section in the width direction is preferably less than 5 mm, and more preferably less than 1 mm.

C. Mechanical Processing of the Outer Circumferential Surface

In the joined product 4 obtained by the joining of the present embodiment, warpage in the in-plane direction (width direction) is small. When the maximum distance $T_1$ mentioned above is preferably 1.0 mm or less, and more preferably 0.5 mm or less, the joined product 4 may be used as a backing plate without outer circumferential processing, but it is preferable to subject the outer circumferential surface to mechanical processing in order to substantially remove the warpage in the in-plane direction (width direction) in appearance. When subjecting the outer circumferential surface to mechanical processing, the processing is performed such that the groove 2 is generally at the center of the width direction of the joined product 4, for example, the distance between the both ends of the side surface 5a of the first part 5 and the side surface 1a, and the distance between the both ends of the side surface 7b of the first part 7 and the side surface 1b are almost the same. For example, in the case where electron beam welding has been performed, a weld line (weld bead) can be confirmed at the joint of the joining surface, and therefore, the processing position can be determined as described above based on this weld line.

For example, on a horizontal plane, the joined product 4 is fixed with the joining surface of the body 1 and the cover member 3 on the upper side (see, for example, the joined product 4 illustrated in FIG. 6). When fixing the joined product 4 on this horizontal plane, it is preferable to fix it such that the surface of the joined product 4 on the side to be installed (the surface on the side that is to become the pedestal surface) is as close to this horizontal plane as possible. There is no limitation on the fixing method, and for example, it is preferable to dynamically fix it using a restraining tool such as a vise, a clamp, or a vacuum chuck. Then, to achieve the desired length and width, by carrying out mechanical processing such as cutting processing using a cutting tool such as an end mill, a radial cutter, or an R-cutter, or grinding processing using a grinding stone, at least a part of the outer circumferential surface, preferably the entire longitudinal side surfaces, and more preferably the entire outer circumferential surface (all side surfaces) is subjected to mechanical processing. By bringing the cutting tool into contact with the side surfaces of the joined product 4 while rotating it around the axis, the outer circumferential surface of the joined product 4 can be subjected to cutting processing. By doing so, the joined product 4 (and hence the backing plate) is finished to a shape with substantially no warpage in the in-plane direction (width direction) in appearance. Specifically, when the longitudinal side surfaces of the joined product 4 are generally planar, preferably planar, and the opposing longitudinal side surfaces are generally parallel, preferably parallel to each other, it can be said that there is substantially no warpage in the in-plane direction (width direction) in appearance. Also, the outer circumferential surface may be a surface having mechanical processing marks, such as a cut surface, a ground surface, or a polished surface, and may be further subjected to finishing processing to a mirror surface. When finishing processing to a mirror surface with small surface roughness is carried out, for example, after bonding the target material by bonding with a solder material, polishing of the side surfaces oxidized by heating can be carried out in a short time.

D. Mechanical Processing of the Joining Surface

For example, on a horizontal plane, the joined product 4 is fixed with the joining surface of the body 1 and the cover member 3 on the upper side (see, for example, the joined product 4 illustrated in FIG. 6). And, when fixing the joined product 4 on this horizontal plane, it is preferable to fix it such that the surface of the joined product 4 on the side to be installed (the surface on the side that is to become the pedestal surface) is as close to this horizontal plane as possible, preferably by pressing down on it. Then, the joined product is fixed such that the difference between the maximum value and the minimum value of the height measured at the surface of the cover member 3 (that is, the distance from this horizontal plane to the measured point on the surface of the cover member 3) is preferably less than 0.5 mm, more preferably 0.4 mm to 0 mm, and still more preferably 0.3 mm to 0 mm, and if required, at least a part of the joining surface, preferably the entire joining surface, along with the cover member 3, is processed to be horizontal by mechanical processing such as cutting.

Also, if the parallelism of the joining surface and the pedestal surface to each other can be guaranteed, the following method may be used as the fixing method of the joined product 4 in the step (D). On the horizontal plane described above, the joined product is fixed with the joining surface of the body 1 and the cover member 3 of the joined product 4 as the upper surface (or upper side) such that its pedestal surface is grounded to the horizontal plane as much as possible. When fixing the joined product 4 on this horizontal plane, it is preferable to fix it such that the maximum value of the distance between this horizontal plane and the bottom surface of the joined product 4 (the surface on the side that is to become the pedestal surface) is preferably less than 0.5 mm, more preferably 0.4 mm to 0 mm, and still more preferably 0.3 mm to 0 mm, and after that, at least a part of the joining surface, preferably the entire joining surface is processed to be horizontal by mechanical processing such as cutting, as described above.

There is no particular limitation on the fixing method for the joined product 4, especially for the body 1, and for example, it is preferable to dynamically fix it using a restraining tool such as a vise, a clamp, or a vacuum chuck. When it is fixed by using a restraining tool such as a vice or a clamp, for example, the joined product 4 can be fixed on the horizontal plane by disposing a plurality of restraining tools in the longitudinal direction of the joined product 4 and holding the side sections of the joined product to sandwich them. The restraining tools are evenly placed at least at three locations in the longitudinal direction of the joined product 4, at the both end sections and the central section, and preferably at five or more locations, including additional locations at ¼ and ¾ of the longitudinal direction. When the difference between the maximum value and the minimum value in the height measured on the surface of the cover member 3 (height from the horizontal plane) is not less than 0.5 mm, the joined product 4 is temporarily fixed with a vise to the extent that it does not move, and then struck with a wooden mallet, plastic hammer, or the like to be grounded on the horizontal plane so that the surface of the cover member 3 can be fixed in a horizontal state. Alternatively, in the case of fixing with a vacuum chuck, for example, before joining the body 1 and the cover member 3, the pedestal surface side of the body 1 is subjected to cutting processing to fabricate a flat surface, and O-rings are disposed around the joined product such that the centers thereof are positioned at locations within 30 mm, preferably 5 mm to 20 mm, from the edge sections of the joined product to increase the adsorption area. Then, by performing vacuum suction for fixation to a vacuum degree (gauge pressure) of −0.1 MPa with the pedestal surface side as the adsorption surface, the surface of the cover member 3 can be fixed in a horizontal state.

Also, there is no particular limitation on the position where the height is measured on the surface of the cover member 3, but it is preferable, for example, to perform the measurement above the groove 2 (more specifically, the first parts 5 and 7 of the groove 2), and it is still more preferable to perform the measurement above the central part of the groove 2 (more specifically, the first parts 5 and 7 of the groove 2).

There is no particular limitation on the method for measuring the height, but for example, the measurement can be performed using a height gauge, a dial gauge, or the like.

By processing at least a part of the joining surface, preferably the entire surface, to be horizontal by mechanical processing such as cutting, preferably by processing it to be horizontal by face milling, in a state where the joined product 4 is fixed such that the difference between the maximum value and the minimum value of the height measured at the surface of the cover member 3 is preferably less than 0.5 mm, more preferably 0.4 mm to 0 mm, and still more preferably 0.3 mm to 0 mm, the thickness of the cover member after the processing can be made uniform. Preferably, the difference between the maximum value and the minimum value of the thickness of the cover member after the processing can be made to be 0.5 mm or less, preferably 0.4 mm or less, more preferably 0.35 mm to 0 mm, and still more preferably 0.3 mm to 0 mm. It is preferable that the above difference between the maximum value and the minimum value of the thickness of the cover member should be determined by performing the measurement above the central section of the groove over the generally entire length of the cover member in the longitudinal direction.

Note that there is no particular limitation on the processing of the joining surface, as long as the joining surface can be treated by mechanical processing, and for example, processing can be carried out by milling, flat surface grinding, end milling, and lathe processing. By doing so, the joining surface becomes a surface that preferably has mechanical processing marks all over, for example, a cut surface, a ground surface, or a polished surface.

E. Mechanical Processing of the Pedestal Surface

The joined product 4 may be fixed with, for example, a vacuum chuck or the like, with its pedestal surface positioned on the upper side, and the pedestal surface of the joined product 4 may be further processed using, for example, milling, grinding, end milling, lathe processing, or the like.

This processing by cutting is for processing the pedestal surface to be generally parallel, preferably parallel, to the joining surface of the joined product 4.

F. Finishing Processing of the Joining Surface

The joined product 4 may be fixed with, for example, a vacuum chuck or the like, with its joining surface positioned on the upper side, and the joining surface of the joined product 4 may be subjected to finishing processing, using, for example, milling, grinding, end milling, lathe processing, polishing, or the like.

This finishing processing is for adjusting the surface roughness of the joining surface of the joined product 4 depending on its application, or for finishing the joining surface by cutting, grinding, or polishing it to a mirror surface, if required. By doing so, the joining surface becomes a surface that has mechanical processing marks, for example, a cut surface, a ground surface, or a polished surface. When finishing processing to a mirror surface with small surface roughness is carried out on the joining surface, for example, after bonding the target material by bonding with a solder material, polishing of the surface of the joining surface oxidized by heating can be carried out in a short time.

G. Finishing Processing of the Pedestal Surface

The joined product 4 may be fixed with, for example, a vacuum chuck or the like, with its pedestal surface positioned on the upper side, and the pedestal surface of the joined product 4 may be subjected to finishing processing, using, for example, milling, grinding, end milling, or the like.

The backing plate 20 obtained in this manner is illustrated in FIG. 4 and FIG. 6. Also, at an arbitrary stage before carrying out the finishing processing on the pedestal surface, a pedestal section 19 may be formed on the pedestal surface, if required. The backing plate 21 obtained in this manner is illustrated in FIG. 5 and FIG. 6. There is no particular limitation on the method for forming the pedestal section 19, and for example, milling, grinding, end milling, lathe processing, polishing, or the like can be used.

The finishing processing of the pedestal surface may be carried out separately for the above-mentioned pedestal section 19 and the surrounding parts other than that.

This finishing processing may be for adjusting the surface roughness of the pedestal surface of the joined product 4 (in some cases, both the above-mentioned pedestal section 19 and the surrounding parts other than that) depending on its application, or for processing the pedestal surface to a mirror surface, if required. Through the above finishing processing, the pedestal surface becomes a surface that has mechanical processing marks, for example, a cut surface, a ground surface, or a polished surface. If the finishing processing is carried out such that mechanical processing marks remain on the pedestal surface, for example, when bonding the target material by bonding with a solder material, the wettability of the solder material can be improved.

H. Drilling Processing

If required, through holes may be formed in the part of the body 1 of the backing plate where the groove 2 and the pedestal section 19 are not formed. By passing bolts or the like through such through holes, the body 1 can be fixed to the sputtering apparatus. There is no particular limitation on the method for forming the through holes, and for example, they can be formed by using a drill or the like. In addition, there is no particular limitation on the dimensions, positions, number, or the like of the through holes.

I. Warpage Correction in the Thickness Direction

Furthermore, if required, it is preferable to correct the joined product 4 by performing the warpage correction in the thickness direction described above in the step B until the size of the warpage in the thickness direction becomes less than 2 mm, preferably 1 mm to 0 mm, and more preferably 0.5 mm to 0 mm.

Also, such warpage correction may be carried out at any stage of backing plate production.

In the above manner, the backing plate 20 or 21 of the present embodiment is produced (see FIG. 4 and FIG. 5).

The backing plate of the present embodiment is a backing plate comprising the plate-shaped body 1 having the groove 2 on one side through which a fluid passes and the plate-shaped cover member 3 disposed on the body 1 so as to cover the groove 2 of the body 1, wherein: the body 1 and the cover member 3 are integrated by joining; the groove 2 has two first parts 5 and 7 extending in the longitudinal direction of the body 1; and the differences between the maximum value and the minimum value of the distances from the longitudinal side surfaces 1a and 1b of the body 1 to the closest longitudinal side surfaces 5a and 7b of the first parts 5 and 7 (as illustrated in FIG. 4, $d_1$ and $d_3$, respectively) are less than 1 mm or less. This provides a backing plate in which displacement of the groove 2 in the in-plane direction is reduced.

In the present invention, there is no particular limitation on the shape of the backing plate. For example, a plate (or panel or rectangular solid) shape as a whole, as illustrated in FIG. 4 and FIG. 5, is preferable.

In the present invention, there is no particular limitation on the dimensions of the backing plate (note that, as mentioned above, the description for the dimensions of the backing plate may be applied as the description for the dimensions of the joined product 4 as it is). For example, when the backing plate has a plate (or panel or rectangular solid) shape, the length of the backing plate (more specifically, the length of the body in the backing plate) is, for example, 400 mm to 5000 mm, preferably 1000 mm to 4500 mm, more preferably 2000 mm to 4000 mm, still more preferably 2050 mm to 3850 mm, and even more preferably 2400 mm to 3500 mm. In addition, the width of the backing plate (more specifically, the width of the body in the backing plate) is, for example, 100 mm to 2000 mm, preferably 150 mm to 1500 mm, more preferably 180 mm to 500 mm, even more preferably 200 mm to 400 mm, especially preferably 200 mm to 300 mm, and particularly preferably 200 mm to 285 mm. Note that the length and the width may be the same as or different from each other, but it is easier to achieve the effects of the present invention when the width is small.

The backing plate in the present embodiment may have a long dimension. In that case, the length of the backing plate (more specifically, the length of the body in the backing plate) may be greater than 2000 mm, and for example, may be greater than 2000 mm and 5000 mm or less. In addition, the ratio of the length to the width (length/width, that is, aspect ratio) of the backing plate (more specifically, the aspect ratio of the body in the backing plate) is 3.1 or more, preferably 6.0 or more, still more preferably 7.0 or more, even more preferably 7.0 or more and 40.0 or less, even further preferably 7.5 or more and 30 or less, peculiarly preferably 8 or more and 20 or less, and particularly preferably 8.5 or more and 15 or less. When the ratio of the length to the width (aspect ratio) of the backing plate is within the above range, it is easier to achieve the effect of reducing the displacement of the groove inside the backing plate.

The thickness of the backing plate (that is, the average value of the distance between the pedestal surface (if the pedestal section is present, the pedestal surface of the pedestal section) and the joining surface) is, for example, 5 mm to 30 mm, preferably 7 mm to 25 mm, and more preferably 10 mm to 20 mm. However, there is no particular limitation on the thickness of the backing plate as long as it is possible to form a flow channel inside the backing plate.

The thickness of the cover member 3 of the backing plate (that is, the average value of the distance between the joining surface and the flow channel) may have a thickness of, for example, 1.5 mm or more and 7 mm or less, preferably 2 mm or more and 5 mm or less, more preferably 2.5 mm or more and 4 mm or less, still more preferably 2.7 mm or more and 3.5 mm or less, and particularly preferably 3 mm or more and 3.3 mm or less. When the thickness of the cover member 3 is at the lower limit value described above or more, the deformation during pressurization to the flow channel can be suppressed or the amount of deformation can be reduced. Also, when the thickness of the cover member 3 is at the upper limit value described above or less, the depth of the region to be joined between the cover member 3 and the body 1 (joining depth) can be made relatively shallow, which makes it easier to reduce the amount of heat input during joining and can suppress the deformation of the groove part during joining.

There is no limitation on the shape of the flow channel formed inside the backing plate, as long as the groove has at least two first parts extending in the longitudinal direction of the body, and it may be a shape that is capable of cooling the target material disposed on the pedestal surface of the backing plate. For example, when the flow channel has a rectangular cross-section, as in the embodiment illustrated, its dimension in the width direction is, for example, 10 mm to 100 mm, preferably 20 mm to 80 mm, more preferably 30 mm to 70 mm, and still more preferably 40 mm to 60 mm. Also, its dimension in the height direction is, for example, 1 mm to 20 mm, preferably 2 mm to 15 mm, more preferably 3 mm to 10 mm, and still more preferably 4 mm to 7 mm. In the backing plate, the bottom surface of the groove 2 and the rear surface of the cover member 3 are preferably generally parallel, and more preferably parallel to each other. Depending on the size of the backing plate, a plurality of flow channels may be formed.

As illustrated in FIG. 4(a), in the cover member 3 of the backing plate, holes 11a and 11b with arbitrary dimensions may be formed at any locations thereof, allowing fluid connection with the groove (or flow channel) 2 formed in the body 1. Note that there is no particular limitation on the number of holes 11a and 11b.

Furthermore, a plurality of holes, preferably through holes (not illustrated), may be formed in the body 1 of the backing plate in order to allow attachment to the sputtering apparatus.

In addition, as illustrated in the backing plate 21 in FIG. 5 and FIG. 6, on its pedestal surface, the pedestal section 19, on which the target material can be disposed, may be formed.

According to the present embodiment, the displacement of the groove 2 in the joined product 4 obtained after joining, and hence in the backing plate 20 or 21, can be reduced. In particular, in a joined product 4 that has been subjected to outer circumferential processing to remove warpage in the in-plane direction in appearance, and hence in the backing plate 20 or 21, the difference between the maximum value and the minimum value of the distances from the longitudinal side surfaces 1a and 1b of the body 1 to the nearest longitudinal side surfaces of the first parts 5 and 7 of the groove 2 (as illustrated in FIG. 4, the distance $d_1$ between the longitudinal side surface 1a of the body 1 and the longitudinal side surface 5a of the first part 5 of the groove 2, and the distance $d_3$ between the longitudinal side surface 1b of the body 1 and the longitudinal side surface 7b of the first part 7 of the groove 2) can be made to be less than 1 mm.

Embodiment 2

The present embodiment relates to a sputtering target having a backing plate. Hereinafter, at first, a production method for this sputtering target will be described in detail.

A production method for a sputtering target of the present embodiment comprises bonding a target material to a backing plate produced by the production method mentioned in the above Embodiment 1.

A sputtering target can be produced by, to the backing plate obtained as mentioned above in Embodiment 1, bonding (or joining) the target material to the pedestal surface of the backing plate using a solder material or brazing material.

There is no particular limitation on the target material, as long as it is constituted from materials such as metals, alloys, or ceramics or sintered materials including oxides and nitrides that may be normally used for film formation by the sputtering method, and the target material may be selected as appropriate depending on the application and purpose. Examples of such a target material include, for example, metal materials selected from the group consisting of single metals such as Al, Cu, Cr, Fe, Ta, Ti, Zr, W, Mo, Nb, Ag, Co, Ru, Pt, Pd, and Ni, and alloys mainly composed thereof, and tin doped indium oxide (ITO), aluminum doped zinc oxide (AZO), gallium doped zinc oxide (GZO), In—Ga—Zn composite oxide (IGZO), and the like. Among the above, aluminum (pure Al with a purity of 99.99% (4N) or more, preferably 99.999% (5N) or more), an aluminum alloy (containing Si, Cu, Nd, Mg, Fe, Ti, Mo, Ta, Nb, W, Ni, Co, or the like as an additive element, preferably containing Si or Cu as an additive element; the Al purity of the base metal excluding the additive element is 99.99% or more, preferably 99.999% or more), and copper (purity of 99.99% (4N) or more) are preferable.

In the production method of the present embodiment, the target material may be processed into a general plate shape, but the method for processing it into a plate shape is not particularly limited. In the case where the target material is metallic, it can be produced by, for example, subjecting a rectangular solid-shaped or cylinder-shaped target material obtained by melting and/or casting to plastic processing such as rolling, extrusion, or forge processing, followed by mechanical processing such as cut-off processing, milling, or end milling, thereby finishing it to the desired size and surface condition. On the other hand, in the case where the target material is a high melting point metal or sintered material of oxide, it can be produced by: obtaining a plate-shaped sintered material by, for example, the pressure sintering method in which the target material is filled into a plate-shaped mold and sintered by hot pressing or with a hot isostatic pressing apparatus or the atmospheric sintering method in which green compact is obtained by cold isostatic pressing, injection molding, or the like and then sintered under atmospheric pressure; and then subjecting the plate-shaped material to mechanical processing such as cut-off processing, milling, or end milling, and to grinding, thereby finishing it to the desired size and surface condition.

There is no particular limitation on the solder material used for joining the target and the backing plate, and it is preferably a material containing a metal or alloy having a low melting point (for example, 723 K or lower). Examples thereof include, for example, materials containing metals selected from the group consisting of indium (In), tin (Sn), zinc (Zn), lead (Pb), silver (Ag), copper (Cu), bismuth (Bi), cadmium (Cd), and antimony (Sb) or alloys thereof. More specifically, mention may be made of In, In—Sn, Sn—Zn, Sn—Zn—In, In—Ag, Sn—Pb, Sn—Pb—Ag, Sn—Bi, Sn—Ag—Cu, Pb—Sn, Pb—Ag, Zn—Cd, Pb—Sn—Sb, Pb—Sn—Cd, Pb—Sn—In, Bi—Sn—Sb, and the like. As the solder material for sputtering targets, In, In alloys, and Sn alloys, which generally have low melting points, may be widely used.

In general, simply placing the above solder material on the target material or backing plate does not provide sufficient joining strength due to the influence of the oxide film that may exist on the surface of the target material or backing plate. Therefore, in order to improve the wettability of the solder material against their surfaces, a metallization treatment may be performed to provide a metallization layer composed of the solder material for metallization and metal atoms contained in the target material or backing plate on the surface of the target material or backing plate. The metallization treatment is carried out using, for example, an ultrasonic soldering iron.

The solder material that can be used for metallization is, for example, a material containing a metal selected from the group consisting of indium (In), tin (Sn), zinc (Zn), lead (Pb), silver (Ag), copper (Cu), bismuth (Bi), cadmium (Cd), and antimony (Sb), or an alloy thereof. More specifically, mention may be made of In, In—Sn, Sn—Zn, Sn—Zn—In, In—Ag, Sn—Pb—Ag, Sn—Bi, Sn—Ag—Cu, Pb—Sn, Pb—Ag, Zn—Cd, Pb—Sn—Sb, Pb—Sn—Cd, Pb—Sn—In, Bi—Sn—Sb, and the like. A material with high affinity to the target material or backing plate may be selected as appropriate.

In the above manner, the sputtering target of the present embodiment, in which the target material is bonded onto the backing plate, is produced.

According to the present embodiment, in the sputtering target, the displacement of the groove of the backing plate in the in-plane direction can be reduced. If the displacement of the groove becomes larger, the heat transfer efficiency may change locally, and in the case of a sputtering target in which the target material is bonded by the solder material, local delamination of the target material may occur during sputtering. When the target material is delaminated, the distance between the target material and the substrate changes at that location, which may cause problems such as adverse effects on the characteristics of the thin film deposited by sputtering. On the other hand, the sputtering target of the present embodiment can substantially eliminate such risks.

In the above, two embodiments of the present invention have been described, but various modifications may be made to these embodiments within the scope of the present invention. For example, in the above embodiment, description has been given for the case where there are two first parts and four first regions to be joined corresponding to them, one second part connecting the two adjacent first parts and two second regions to be joined corresponding to it, and two third regions to be joined positioned at the both end sections of the groove 2. The numbers of first parts, first regions to be joined, second parts, second regions to be joined, and third regions to be joined are not limited to the above, and more of them may be present.

EXAMPLES

Hereinafter, the present invention will be described in further detail with reference to Examples, but the present invention is not limited to the following Examples.

Example 1

In accordance with Embodiment 1, the backing plate 20 illustrated in FIG. 4 was produced as follows, using the body 1 and the cover member 3 with the shapes illustrated in FIG. 1 and FIG. 6. The groove 2 was provided such that it constituted line symmetry with respect to the center line in the width direction along the longitudinal direction of the generally rectangular solid-shaped body 1, and that each of the longitudinal side surfaces of the groove 2 was a plane that was parallel to the above center line and parallel to each other in the vertical direction.

A. Joining of Body and Cover Member

The joining of the body and the cover member was performed by electron beam welding using an electron beam welding machine manufactured by Steigerwald Strahltechnik GmbH., in a state where the body was fixed to the fixing table of the electron beam welding machine with a vise. As illustrated in FIG. 3(*b*), the body and the cover member were joined by joining the first regions to be joined 15*a*, 15*b*, 17*a*, and 17*b* at first in the following order: from the point i to the point b, from the point j to the point a, from the point k to the point d, from the point l to the point c, from the point m to the point f, from the point n to the point e, from the point o to the point h, and from the point p to the point g, and then joining the second regions to be joined 16*a* and 16*b* and the third regions to be joined 18*a* and 18*b* in the order from the point b to the point d, from the point f to the point h, from the point a to the point e, and from the point g to the point c.

The electron beam welding was performed by scanning the electron beam such that the center of the electron beam hit the joint between the body and the cover member observed on the joining surface side, and the welding depth in the joined region was 8 to 10 mm (the thickness of the cover member used was 5 mm). The size of the joined product thus obtained was 2600 mm long, 280 mm wide (aspect ratio: 9.29), and 20 mm high.

The materials and design target values for each member were as follows.
Body: Oxygen-Free Copper Plate (Rolled Plate Manufactured by Mitsubishi Shindoh Co., Ltd., C1020-1/2H)
   Vickers hardness of 90
   tensile strength of 280 MPa
   electrical conductivity of >101% IACS (20° C.)
Cover Member: Oxygen-Free Copper Plate (Rolled Plate Manufactured by Mitsubishi Shindoh Co., Ltd., C1020-1/2H)
   Vickers hardness of >90
   tensile strength of 280 MPa
   electrical conductivity of >101% IACS (20° C.)
Design Target Values for the Backing Plate
   length of backing plate (=length of body): 2500 mm
   width of backing plate (=width of body): 270 mm
   aspect ratio of backing plate: 9.26 thickness of backing plate (=thickness in groove part of body+thickness of cover member+height of flow channel): 16 mm
  thickness in groove part of body: 8 mm
  thickness of cover member: 3 mm
  length of cover member: 2350 mm
  entire width of cover member: 175 mm (=70 mm (dimension in width direction of long straight part)+35 mm (dimension in width direction of intermediate part)+70 mm (dimension in width direction of long straight part))
  entire width of flow channel: 165 mm (=60 mm (dimension in width direction of long straight part, that is, distance between side surface 5a and side surface 5b)+45 mm (dimension in width direction of intermediate part, that is, distance between side surface 5b and side surface 7a)+60 mm (dimension in width direction of long straight part, that is, distance between side surface 7a and side surface 7b))
  height (or thickness) of flow channel: 5 mm
  length of flow channel: 2300 mm B. Warpage Correction in the Thickness Direction Since the joined product after the joining was warped toward the joining surface side in both the longitudinal direction and the width direction, it was corrected by performing press molding such that the warpage was less than 1 mm.

C. Mechanical Processing of the Outer Circumferential Surface

Thereafter, the joined product was fixed with a vise such that its joining surface was on the upper side, and that joining surface was subjected to end milling using a double column type machining center. At that time, the joined product was fixed such that the straight line connecting the both ends of the side surface on the long side was almost parallel to the processing direction, using the weld line as a reference, and end milling was performed such that the flow channel was disposed at the center of the width direction of the joined product.

D. Mechanical Processing of the Joining Surface

Next, the joined product was fixed with a vise such that its joining surface was on the upper side (such that the difference between the maximum value and the minimum value of the height measured at the joining surface was less than 0.5 mm), and that joining surface was subjected to milling using a double column type machining center.

E. Mechanical Processing of the Pedestal Surface

Subsequently, the joined product after the above milling was fixed with a vacuum chuck such that its pedestal surface was on the upper side, and that pedestal surface was subjected to milling using a double column type machining center.

The backing plate 20 of the present Example produced in the above manner was cut off in the width direction Y at a plurality of positions along the longitudinal direction X (corresponding to the distances from the position at the flow channel side surface on the side of the width direction side surface 1c as zero to a plurality of positions in the direction toward the other width direction side surface 1d), and measurements were performed using a caliper to determine the distance $d_1$ from one longitudinal side surface 1a in the body 1 to the nearest longitudinal side surface 5a of the first parts 5 and 7 of the groove 2, the distance $d_2$ between mutually adjacent longitudinal side surfaces 5b and 7a of the first parts 5 and 7 of the groove 2, and the distance $d_3$ from the other longitudinal side surface 1b of the body 1 to the nearest longitudinal side surface 7b of the first parts 5 and 7 of the groove 2. The results are shown in FIG. 7 and Table 2 (the center of the flow channel in the longitudinal direction is at the position of 1165 mm). Note that, in the joined product of the present Example before the mechanical processing, the warpage to one side of the longitudinal side surfaces 1a and 1b (that is, the maximum distortion of the longitudinal side surfaces of the joined product (maximum distance $T_1$)) was 0.1 mm, the proportion of the maximum distance $T_1$ to the length of the joined product was $0.04 \times 10^{-3}$, and the proportion of the maximum distance $T_1$ to the aspect ratio of the joined product was 0.01. In addition, no warpage (that is, the maximum distortion of the longitudinal side surfaces of the joined product (maximum distance $T_1$)) was substantially observed in the backing plate finished by the mechanical processing. The warpage to one side of the longitudinal side surfaces 1a and 1b was measured with a dial gauge attached to a double column type machining center.

TABLE 2

| Position (mm) | $d_1$ (mm) | $d_2$ (mm) | $d_3$ (mm) |
|---|---|---|---|
| 0 | 52.6 | 45.0 | 52.5 |
| 115 | 52.5 | 45.0 | 52.5 |
| 595 | 52.5 | 45.0 | 52.6 |
| 1165 | 52.5 | 45.0 | 52.6 |
| 1745 | 52.5 | 45.0 | 52.6 |
| 2210 | 52.6 | 45.0 | 52.5 |
| 2330 | 52.6 | 45.0 | 52.5 |

As shown in FIG. 7 and Table 2, the difference between the maximum value and the minimum value at the distance $d_1$ and the difference between the maximum value and the minimum value at the distance $d_3$ were both less than 1 mm (0.1 mm), and the maximum distortion of the longitudinal side surfaces of the groove (flow channel) (maximum distance $T_2$) was less than 1 mm (about 0.1 mm). The proportions of the difference between the maximum value and the minimum value of the distance $d_1$ to the length of the backing plate and of the difference between the maximum value and the minimum value of the distance $d_3$ to the length of the backing plate were both $0.04 \times 10^{-3}$, and the proportions of the difference between the maximum value and the minimum value of the distance $d_1$ to the aspect ratio of the backing plate and of the difference between the maximum value and the minimum value of the distance $d_3$ to the aspect ratio of the backing plate were both 0.01. Note that the difference between the maximum value and the minimum value at the distance $d_2$ was also less than 1 mm (less than 0.1 mm).

Also, the backing plate was cut off at the central part of the groove of the cover member, and the thickness of the cover member was measured with a caliper. The difference between the maximum value and the minimum value of the thickness of the cover member, determined by performing the measurement above the center of the groove over the generally entire length of the cover member in the longitudinal direction, was 0.3 mm (the average thickness of the cover member was 3.0 mm), and the variation in the thickness direction was also uniform.

In addition, in the step (D), at least a part of the joining surface was processed by cutting in a state where the joined product was fixed, but almost no effect of such fixation on the warpage or distortion to the backing plate after production was observed, and even though no correction was performed after the mechanical processing, the amount of warpage of the backing plate after production was less than 0.5 mm.

Comparative Example 1

A backing plate was produced in the same manner as in Example 1 except that, with reference to FIG. 3(b), the body and the cover member were joined by joining the first regions to be joined 15a, 15b, 17a, and 17b at first in the following order: from the point i to the point b, from the point j to the point a, from the point m to the point f, from the point n to the point e, from the point o to the point h, from the point p to the point g, from the point k to the point d, and from the point l to the point c, and then joining the second regions to be joined 16a and 16b and the third regions to be joined 18a and 18b in the order from the point b to the point d, from the point f to the point h, from the point a to the point e, and from the point g to the point c.

For the backing plate of the present Comparative Example produced in the above manner, the distances $d_1$, $d_2$, and $d_3$ were measured at a plurality of positions along the longitudinal direction X in the same manner as in Example 1. The results are shown in FIG. 8 and Table 3. Note that, as schematically illustrated in FIG. 9(a), a joined product 30 of the present Comparative Example before the mechanical processing was warped by about 1 mm such that, among the longitudinal side surfaces 1a and 1b, the side of the longitudinal side surface 1b was convex (that is, the maximum distortion of the longitudinal side surfaces of the joined product (maximum distance $T_1$) was 1 mm, the proportion of the maximum distance $T_1$ to the length of the joined product was $0.38 \times 10^{-3}$, and the proportion of the maximum distance $T_1$ to the aspect ratio of the joined product was 0.11), and the center of the warpage was near the central section of the flow channel in the longitudinal direction. In addition, as schematically illustrated in FIG. 9(b), no warpage (that is, the maximum distortion of the longitudinal side surfaces of the joined product (maximum distance $T_1$)) was substantially observed in a backing plate 31 of the present Comparative Example finished by the mechanical processing.

TABLE 3

| Position (mm) | $d_1$ (mm) | $d_2$ (mm) | $d_3$ (mm) |
|---|---|---|---|
| 0 | 52.5 | 44.9 | 52.6 |
| 115 | 52.9 | 44.9 | 52.1 |
| 595 | 53.4 | 44.9 | 51.7 |
| 1165 | 53.5 | 44.9 | 51.5 |
| 1745 | 53.2 | 44.9 | 51.7 |
| 2210 | 52.7 | 44.8 | 52.3 |
| 2330 | 52.5 | 44.9 | 52.5 |

As shown in FIG. 8 and Table 3, the difference between the maximum value and the minimum value at the distance $d_1$ was 1 mm and the difference between the maximum value and the minimum value at the distance $d_3$ was greater than 1 mm, and the maximum distortion of the longitudinal side surfaces of the groove (flow channel) (maximum distance $T_2$) was 1 mm or more (about 1.1 mm). The proportions of the difference between the maximum value and the minimum value of the distance $d_1$ to the length of the backing plate and of the difference between the maximum value and the minimum value of the distance $d_3$ to the length of the backing plate were $0.40 \times 10^{-3}$ and $0.44 \times 10^{-3}$, respectively, and the proportions of the difference between the maximum value and the minimum value of the distance $d_1$ to the aspect ratio of the backing plate and of the difference between the maximum value and the minimum value of the distance $d_3$ to the aspect ratio of the backing plate were 0.11 and 0.12, respectively. Note that the difference between the maximum value and the minimum value at the distance $d_2$ was less than 1 mm (0.1 mm).

Therefore, the displacement of the groove was found to be reduced in the backing plate produced in the Example 1 mentioned above, compared to the backing plate produced in Comparative Example 1.

Example 2

A backing plate was produced in the same manner as in Example 1 except that, as illustrated in FIG. 3(a), the body and the cover member were joined by joining the first regions to be joined 15a, 15b, 17a, and 17b at first in the following order: from the point a to the point b, from the point c to the point d, from the point e to the point f, and from the point g to the point h, and then joining the second regions to be joined 16a and 16b and the third regions to be joined 18a and 18b in the order from the point b to the point d, from the point f to the point h, from the point a to the point e, and from the point g to the point c, and that the welding depth in the joined region was set to 7 to 9 mm.

For the backing plate of the present Example produced in the above manner, the distances $d_1$, $d_2$, and $d_3$ were measured at a plurality of positions along the longitudinal direction X in the same manner as in Example 1. The results are shown in FIG. 10 and Table 4. Note that, in the joined product of the present Example before the mechanical processing, the warpage to one side of the longitudinal side surfaces 1a and 1b (that is, the maximum distortion of the longitudinal side surfaces of the joined product (maximum distance $T_1$)) was about 0.3 mm, the proportion of the maximum distance $T_1$ to the length of the joined product was $0.12 \times 10^{-3}$, and the proportion of the maximum distance $T_1$ to the aspect ratio of the joined product was 0.03. Also, the center of the warpage was near the central section of the flow channel in the longitudinal direction. In addition, no warpage (that is, the maximum distortion of the longitudinal side surfaces of the joined product (maximum distance $T_1$)) was substantially observed in the backing plate finished by the mechanical processing.

TABLE 4

| Position (mm) | $d_1$ (mm) | $d_2$ (mm) | $d_3$ (mm) |
|---|---|---|---|
| 0 | 52.5 | 45.0 | 52.7 |
| 115 | 52.5 | 45.0 | 52.6 |
| 595 | 52.5 | 45.0 | 52.5 |
| 1165 | 52.6 | 45.0 | 52.4 |
| 1745 | 52.5 | 45.1 | 52.5 |
| 2210 | 52.3 | 45.1 | 52.7 |
| 2330 | 52.3 | 45.0 | 52.7 |

As shown in FIG. 10 and Table 4, the difference between the maximum value and the minimum value at the distance $d_1$ and the difference between the maximum value and the minimum value at the distance $d_3$ were both less than 1 mm (0.3 mm), and the maximum distortion of the longitudinal side surfaces of the groove (flow channel) (maximum distance $T_2$) was less than 1 mm (about 0.3 mm). The proportions of the difference between the maximum value and the minimum value of the distance $d_1$ to the length of the backing plate and of the difference between the maximum value and the minimum value of the distance $d_3$ to the length of the backing plate were both $0.12 \times 10^{-3}$, and the proportions of the difference between the maximum value and the minimum value of the distance $d_1$ to the aspect ratio of the backing plate and of the difference between the maximum value and the minimum value of the distance $d_3$ to the aspect ratio of the backing plate were both 0.03. Note that the difference between the maximum value and the minimum value at the distance $d_2$ was also less than 1 mm (0.1 mm).

Also, the backing plate was cut off at the central part of the groove of the cover member, and the thickness of the cover member was measured with a caliper. The difference between the maximum value and the minimum value of the thickness of the cover member, determined by performing the measurement above the center of the groove over the generally entire length of the cover member in the longitudinal direction, was 0.2 mm (the average thickness of the cover member was 3.0 mm), and the variation in the thickness direction was also uniform.

Therefore, as with the backing plate produced in the Example 1 mentioned above, the displacement of the groove was also found to be reduced in the backing plate produced in Example 2, compared to the backing plate produced in Comparative Example 1.

Example 3

A backing plate was fabricated in the same manner as in Example 1, and a pressure resistance test was carried out by applying water pressure of 0.5 MPa to the flow channel in the backing plate through a hole leading to the flow channel, provided in the cover member. After holding the backing plate under pressure for 30 minutes, the cover member was checked for deformation in an unloaded state, and no deformed location was found. In addition, after the pressure resistance test, a He leak test for the flow channel was carried out using a He leak apparatus manufactured by ULVAC, Inc., but the leak rate was $5.0 \times 10^{-10}$ Pa·m$^3$/s or less and no leakage was observed.

On the backing plate, which was confirmed to be free of deformation and leakage by the above pressure resistance test and He leak test for the flow channel, an aluminum target of 2250 mm×200 mm×15 mm thick was bonded using indium solder, thereby fabricating a sputtering target. During the bonding operation, the backing plate was heated to 240° C., but no significant warpage occurred, and when the joining rate was inspected using an ultrasonic flaw detector, the joining rate was 99% or more, and a sputtering target could be fabricated in which the entire surface of the target material was uniformly bonded.

Comparative Example 2

A backing plate was produced following the design target values shown below. The same materials as in Example 1 were used for each member.
Design Target Values for the Backing Plate
   length of backing plate: 800 mm
   width of backing plate: 270 mm
   aspect ratio of backing plate: 2.96
   thickness of backing plate (=thickness in groove part of body+thickness of cover member+height of flow channel): 18 mm
   thickness in groove part of body: 8 mm
   thickness of cover member: 5 mm
   length of cover member: 710 mm
   entire width of cover member: 175 mm (=70 mm (dimension in width direction of long straight part)+35 mm (dimension in width direction of intermediate part)+70 mm (dimension in width direction of long straight part))
   entire width of flow channel: 165 mm (=60 mm (dimension in width direction of long straight part, that is, distance between side surface 5a and side surface 5b)+45 mm (dimension in width direction of intermediate part, that is, distance between side surface 5b and side surface 7a)+60 mm (dimension in width direction of long straight part, that is, distance between side surface 7a and side surface 7b))
   height (or thickness) of flow channel: 5 mm
   length of flow channel: 700 mm A backing plate following the design targets described above was produced in the same manner as in Example 1 except that, with reference to FIG. 3(a), the body and the cover member were joined by joining the first regions to be joined 15a, 15b, 17a, and 17b at first in the following order: from the point g to the point h, from the point f to the point e, from the point a to the point b, and from the point d to the point c, and then joining the second regions to be joined 16a and 16b and the third regions to be joined 18a and 18b in the order from the point b to the point d, from the point f to the point h, from the point a to the point e, and from the point g to the point c, thereby producing a joined product with a length of 820 mm, a width of 280 mm (aspect ratio: 2.93), and a height of 20 mm.

For the backing plate of the present Comparative Example produced in the above manner, the distances $d_1$, $d_2$, and $d_3$ were measured at a plurality of positions along the longitudinal direction X in the same manner as in Example 1. The results are shown in FIG. 11 and Table 5. Note that a joined product 30 of the present Comparative Example before the mechanical processing was warped by 0.4 mm such that, among the longitudinal side surfaces 1a and 1b, the side of the longitudinal side surface 1a was convex (that is, the maximum distortion of the longitudinal side surfaces of the joined product (maximum distance $T_1$) was 0.4 mm, the proportion of the maximum distance $T_1$ to the length of the joined product was $0.49 \times 10^{-3}$, and the proportion of the maximum distance $T_1$ to the aspect ratio of the joined product was 0.14), and the center of the warpage was near the central section of the flow channel in the longitudinal direction. In addition, no warpage (that is, the maximum distortion of the longitudinal side surfaces of the joined product (maximum distance $T_1$)) was substantially observed in the backing plate of the present Comparative Example finished by the mechanical processing.

TABLE 5

| Position (mm) | $d_1$ (mm) | $d_2$ (mm) | $d_3$ (mm) |
| --- | --- | --- | --- |
| 0 | 52.5 | 45.0 | 52.5 |
| 100 | 52.5 | 45.0 | 52.5 |
| 225 | 52.3 | 45.0 | 52.7 |
| 350 | 52.1 | 45.0 | 52.9 |
| 475 | 52.2 | 45.0 | 52.7 |
| 600 | 52.4 | 45.0 | 52.5 |
| 700 | 52.5 | 45.0 | 52.5 |

As shown in FIG. 11 and Table 5, the difference between the maximum value and the minimum value at the distance $d_1$ and the difference between the maximum value and the minimum value at the distance $d_3$ were both 0.4 mm, and the maximum distortion of the longitudinal side surfaces of the groove (flow channel) (maximum distance $T_2$) was about 0.5 mm. The proportions of the difference between the maximum value and the minimum value of the distance $d_1$ to the length of the backing plate and of the difference between the maximum value and the minimum value of the distance $d_3$ to the length of the backing plate were both $0.50 \times 10^{-3}$, and the proportions of the difference between the maximum value and the minimum value of the distance $d_1$ to the aspect ratio of the backing plate and of the difference between the maximum value and the minimum value of the distance $d_3$ to the aspect ratio of the backing plate were both 0.14. Note that the difference between the maximum value and the minimum value at the distance $d_2$ was less than 1 mm.

INDUSTRIAL APPLICABILITY

The backing plate and the production method therefor of the present invention can be utilized in a sputtering target, especially a sputtering target that may be used in the production of flat panel displays such as liquid crystal displays (LCDs).

REFERENCE SIGNS LIST

1 Body
2 Groove
3 Cover member
4 Joined product
5 and 7 First part
5a, 5b, 7a, and 7b (Longitudinal) side surface
6 Second part
6a, 6b, 8a, and 8b (Width direction) side surface
11a and 11b Hole
15a, 15b, 17a, and 17b First region to be joined
16a and 16b Second region to be joined
18a and 18b Third region to be joined
19 Pedestal section
20 and 21 Backing plate
X Longitudinal direction
Y Width direction
$d_1$, $d_2$, and $d_3$ Distance

The invention claimed is:

1. A production method for a backing plate, comprising joining a plate-shaped body having a groove on one side through which a fluid passes and a plate-shaped cover member disposed on the body so as to cover the groove of the body, wherein:
the groove has at least two first parts extending in a longitudinal direction of the body;
a region where the body and the cover member are joined to each other has at least four first regions to be joined extending in the longitudinal direction of the body and corresponding to two opposing side surfaces in each of the at least two first parts; and
the joining of the body and the cover member to each other in the at least four first regions to be joined is performed by:
step (a): a step of joining the body and the cover member to each other in one first region to be joined corresponding to one side surface in one first part;
step (b): a step of joining the body and the cover member to each other in one region to be joined, among the remaining regions to be joined, corresponding to one side surface in another first part, which is different from the first part that has been joined in the previous step, where a starting point of the joining is at a position separated from an end point of the joining in the previous step; and
step (c): a step of repeating the step (b).

2. The production method according to claim 1, wherein the joining of the body and the cover member to each other in the at least four first regions to be joined is performed in the same direction.

3. The production method according to claim 2, wherein the same direction is either positive direction or opposite direction from one end side toward the other end side of the at least four first regions to be joined, or a combination of both.

4. The production method according to claim 1, wherein the joining of the body and the cover member to each other in the at least four first regions to be joined is performed one by one in an order that constitutes symmetry in plan view with respect to a center line along the longitudinal direction of the body.

5. The production method according to claim 1, wherein:
the groove has at least one second part extending in a width direction of the body and connecting the two adjacent first parts;
the region where the body and the cover member are joined to each other has at least two second regions to be joined extending in the width direction of the body and corresponding to two opposing side surfaces in the at least one second part; and
the joining of the body and the cover member to each other in the at least two second regions to be joined is performed before or after performing the joining of the body and the cover member to each other in the at least four first regions to be joined.

6. The production method according to claim 1, wherein the body and the cover member are joined to each other by electron beam welding or friction stir welding.

7. A joined product comprising a plate-shaped body having a groove on one side through which a fluid passes and a plate-shaped cover member disposed on the body so as to cover the groove of the body, wherein: the joined product has a length of 1000 mm or more; the body and the cover member are integrated by joining; the groove has at least two first parts extending in a longitudinal direction of the body; and a maximum distortion of a longitudinal side surface of the groove is less than 1 mm.

8. A joined product comprising a plate-shaped body having a groove on one side through which a fluid passes and a plate-shaped cover member disposed on the body so as to cover the groove of the body, wherein: a ratio of a length to a width of the joined product is 3.1 or more; the body and the cover member are integrated by joining; the groove has at least two first parts extending in a longitudinal direction of the body; and a maximum distortion of a longitudinal side surface of the groove is less than 1 mm.

9. A backing plate comprising a plate-shaped body having a groove on one side through which a fluid passes and a plate-shaped cover member disposed on the body so as to cover the groove of the body, wherein: the backing plate has a length of 1000 mm or more; the body and the cover member are integrated by joining; the groove has at least two first parts extending in a longitudinal direction of the body; and a difference between a maximum value and a minimum value of a distance from a longitudinal side surface of the body to a closest longitudinal side surface of the first part is less than 1 mm.

10. A backing plate comprising a plate-shaped body having a groove on one side through which a fluid passes and a plate-shaped cover member disposed on the body so as to cover the groove of the body, wherein: a ratio of a length to a width of the backing plate is 3.1 or more; the body and the cover member are integrated by joining; the groove has at least two first parts extending in a longitudinal direction of the body; and a difference between a maximum value and a minimum value of a distance from a longitudinal side surface of the body to a closest longitudinal side surface of the first part is less than 1 mm.

11. The backing plate according to claim 9, wherein the backing plate has a length greater than 2000 mm.

12. The backing plate according to claim 11, wherein the backing plate has a length greater than 2000 mm and not more than 5000 mm.

13. The backing plate according to claim 9, wherein the ratio of the length to the width of the backing plate is 6.0 or more.

14. The backing plate according to claim 13, wherein the ratio of the length to the width of the backing plate is 7.0 or more and 40.0 or less.

15. A production method for a sputtering target comprising bonding a target material to a backing plate produced by the production method according to claim 1.

16. A sputtering target comprising a target material bonded onto the backing plate according to claim 9.

\* \* \* \* \*